(12) United States Patent
Kimura et al.

(10) Patent No.: US 9,837,475 B2
(45) Date of Patent: Dec. 5, 2017

(54) DISPLAY DEVICE

(71) Applicant: Japan Display Inc., Tokyo (JP)

(72) Inventors: Yasukazu Kimura, Tokyo (JP);
Takuma Nishinohara, Tokyo (JP);
Toshihiko Itoga, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/373,533

(22) Filed: Dec. 9, 2016

(65) Prior Publication Data

US 2017/0179210 A1    Jun. 22, 2017

(30) Foreign Application Priority Data

Dec. 21, 2015 (JP) ................... 2015-248687
Feb. 5, 2016 (JP) ................... 2016-020546

(51) Int. Cl.
| | | |
|---|---|---|
| H01L 27/32 | (2006.01) |
| H01L 51/00 | (2006.01) |
| H01L 51/52 | (2006.01) |
| H01L 29/786 | (2006.01) |
| H01L 27/12 | (2006.01) |

(52) U.S. Cl.
CPC ...... H01L 27/3258 (2013.01); H01L 27/3248 (2013.01); H01L 27/3262 (2013.01); H01L 27/3265 (2013.01); H01L 27/3276 (2013.01); H01L 51/0097 (2013.01); H01L 51/529 (2013.01); H01L 27/1214 (2013.01); H01L 29/78618 (2013.01); H01L 2251/5338 (2013.01)

(58) Field of Classification Search
CPC ............... H01L 27/3258; H01L 51/529; H01L 27/3276; H01L 27/3265; H01L 27/3262; H01L 27/3248; H01L 51/0097; H01L 2251/5338; H01L 27/1214; H01L 29/78618
See application file for complete search history.

(56) References Cited

U.S. PATENT DOCUMENTS

2016/0233251 A1* 8/2016 Sasaki ................ H01L 27/1225

FOREIGN PATENT DOCUMENTS

| JP | 2004-022875 A | 1/2004 |
|---|---|---|
| JP | 2007-288078 A | 11/2007 |

* cited by examiner

Primary Examiner — Roy Potter
Assistant Examiner — Paul Patton
(74) Attorney, Agent, or Firm — Typha IP LLC

(57) ABSTRACT

A display device includes: a flexible substrate; a pixel over the flexible substrate, the pixel including a transistor and a display element; a first wiring for transmitting a signal to the pixel, the first wiring extending in a first direction; a second wiring extending in a second direction intersecting the first direction; an inorganic insulating layer on a higher level than the first wiring or the second wiring; and an organic insulating layer on a higher level than the inorganic insulating layer, wherein the inorganic insulating layer has an opening exposing a part of the upper surface of the first wiring or the second wiring is exposed, and the organic insulating layer is provided in such a way as to fill the opening.

20 Claims, 27 Drawing Sheets

DISPLAY DEVICE

CROSS-REFERENCE TO RELATED APPLICATIONS

This application is based upon and claims the benefit of priority from the prior Japanese Patent Application No. 2015-248687, filed on Dec. 21, 2015, and the prior Japanese Patent Application No. 2016-020546, filed on Feb. 5, 2016, the entire contents of which are incorporated herein by reference.

FIELD

The present invention relates to display devices, and an embodiment of the invention disclosed herein relates to a configuration of an interlayer insulating layer that is provided in a flexible display device.

BACKGROUND

Instead of a flat-plate display device that is fabricated using a hard glass substrate, a sheet-like display device using a flexible substrate such as a plastic film (such a display device being also referred to as "sheet display") is currently under development. Since the sheet display is light in weight, hard to be broken, and capable of being folded or bent into a curved surface, it is expected to be developed for new applications.

In a display unit of the display device, pixels arranged in a matrix are driven by pixel circuits that are formed by thin-film transistors. Each of the thin-film transistors includes a semiconductor film, a gate insulating film, and a gate electrode, and each of the pixel circuits is formed by a scanning signal line, a video signal line, and the like that are provided via an interlayer insulating layer.

However, bending the flexible substrate cracks the gate insulating film and the interlayer insulating film, each of which is made of an inorganic insulating material over substantially the entire surface of the display unit, thus undesirably affecting the reliability of the display device. To address such a problem, Japanese Unexamined Patent Application Publication No. 2007-288078 discloses a structure in which, by removing those portions of a laminate of insulating films (i.e. a laminate including a gate insulating film and an interlayer insulating film) which are present in regions where no thin-film transistors are formed, this insulating film laminate is separated into islands.

Incidentally, a resin substrate that is used as the flexible substrate is higher in moisture permeability and moisture absorbency than a glass substrate and, as such, requires a barrier film constituted by a silicon nitride film or the like. In the display device disclosed in Japanese Unexamined Patent Application Publication No. 2007-288078, even those portions of the insulating films which are provided on foundation surfaces of the thin-film transistors are removed, with the result that moisture diffuses into the display device. Having diffused into the display device, the moisture causes deterioration not only in the thin-film transistors but also in display elements that are formed using liquid crystals and an organic electroluminescence material. Therefore, the display device disclosed in Japanese Unexamined Patent Application Publication No. 2007-288078 can be made higher in resistance to the bending of the flexible substrate but becomes lower in reliability due to the deterioration in the display elements caused by the moisture or the like.

SUMMARY

An embodiment of the present invention provides a display device including: a flexible substrate; a pixel over the flexible substrate, the pixel including a transistor and a display element; a first wiring for transmitting a signal to the pixel, the first wiring extending in a first direction; a second wiring extending in a second direction intersecting the first direction; an inorganic insulating layer on a higher level than the first wiring or the second wiring; and an organic insulating layer on a higher level than the inorganic insulating layer, wherein the inorganic insulating layer has an opening exposing a part of the upper surface of the first wiring or the second wiring is exposed, and the organic insulating layer is provided in such a way as to fill the opening.

An embodiment of the present invention provides a display device including a pixel unit, the pixel unit including: a plurality of pixels arranged in a first direction and a second direction intersecting the first direction; first wirings for transmitting signals to the plurality of pixels arranged in the first direction, the first wirings extending along the first direction; second wirings for transmitting signals to the plurality of pixels arranged along the second direction intersecting the first direction, the second wirings extending in the second direction intersecting the first direction; and an inorganic insulating layer covering at least either the first wirings or the second wirings, wherein the inorganic insulating layer has openings exposing at least either the first wirings or the second wirings, and the openings are provided along at least either the first direction or the second direction intersecting the first direction.

DESCRIPTION OF EMBODIMENTS

Figure 1:
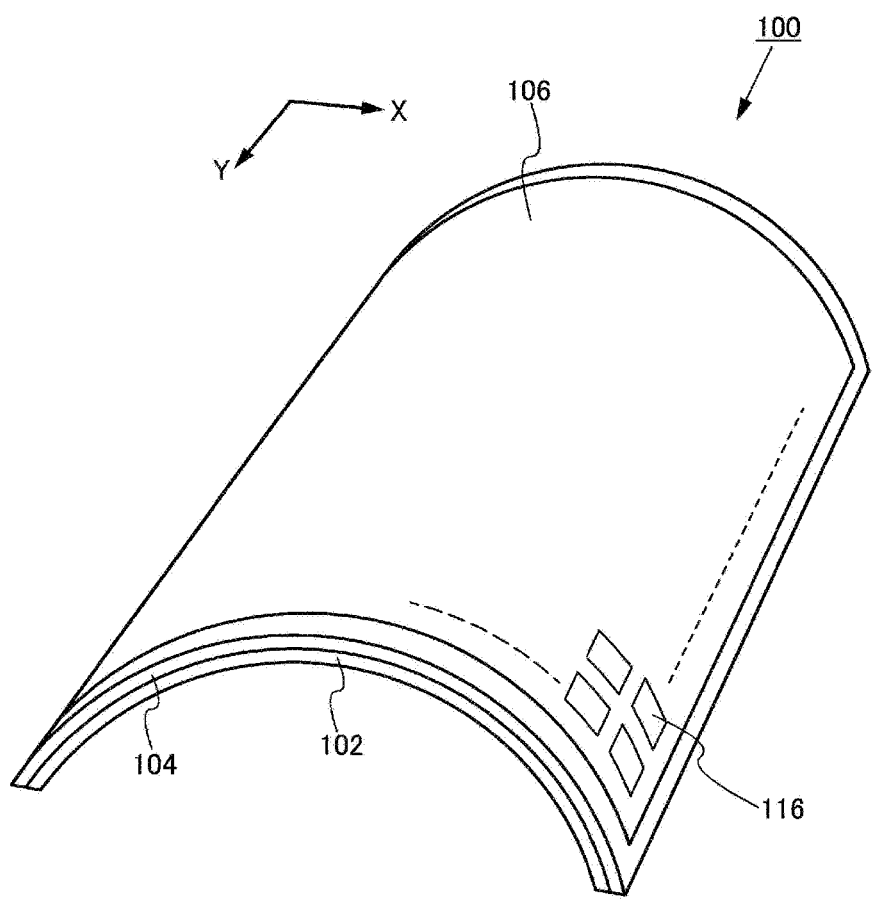
FIG. 1 is a perspective view showing the appearance of a display device according to an embodiment of the present invention.

Embodiments of the present invention are described below with reference to the drawings and the like. Note, however, that the present invention may be carried out in many different aspects and should not be narrowly interpreted within the limits of the contents of description of the embodiments illustrated below. For a clearer description, the drawings may schematically show the width, thickness, shape, and the like of each component in comparison with actual aspects; however, they are mere examples and, as such, are not intended to limit the interpretation of the present invention. Further, in the present specification and each of the drawings, elements that are identical to those previously described with reference to a preceding drawing are given the same reference numerals, and a detailed description of such elements may be omitted as appropriate. Reference numerals each with a letter such as "a" or "b" added to the end of a number may be used for distinguishing identical elements. Furthermore, a word "first" or "second" added to the beginning of an element is a convenient mark that is used for identifying the element, and means nothing more than that unless otherwise noted.

In the present specification, unless otherwise noted, cases where a member or region is located "over (or under)" another member or region encompass not only cases where a member or region is located immediately above (or immediately below) another member or region but also cases where a member or region is located above (or below) another member or region, i.e. cases where another constituent element is inserted above (or below) another member or region.

In the present specification, a display device includes a first substrate. The first substrate has at least one planar principal surface over which a plurality of thin films are provided to form a layered structure. The following description bases a cross-sectional view on the principal surface of the first substrate and refers to the upper side of the principal surface as "over", "higher level", or "above".

Outline of Display Device

FIG. 1 is a perspective view of a display device 100 according to an embodiment of the present invention. The display device 100 includes a pixel unit 106 in which a plurality of pixels 116 are arranged, and this pixel unit 106 forms a display screen. The pixels 116 are formed on a first substrate 102. The first substrate 102 is a flexible substrate. For example, the first substrate 102 is a sheeted organic resin film. Further, the pixel unit 106 provided on the first substrate 102 is covered with a second substrate 104. The second substrate 104 is a sealing member, and as with the first substrate 102, the second substrate 104 may be a sheeted member. Alternatively, a coating of resin material may be provided as a sealing member that corresponds to the second substrate 104.

In a case where the pixel unit 106 is provided on the first substrate 102, the display device 100 has two possibilities: the display screen is viewed from either the second substrate 104 side or the first substrate 102 side. It is assumed that the display device 100 shown in FIG. 1 is configured such that the display screen that is formed by the pixel unit 106 is viewed from the second substrate 104 side.

With the flexibility of the first substrate 102, the display device 100 enables the display screen to be bent in at least one direction. FIG. 1 shows an example of a state where the display device 100 is bent in a first direction (i.e. an X direction shown in FIG. 1). The display device 100 is bent so that the display screen forms a convex surface. It should be noted that although FIG. 1 shows an example where the display device 100 bends in the X direction, the present invention is not limited to this example. The display device 100 is also bendable in a second direction (i.e. a Y direction shown in FIG. 1) intersecting the first direction and, furthermore, is bendable in both the X and Y directions. Further, the display device 100 is configured to be also bendable in an oblique direction with respect to the X and Y directions. In addition to allowing the display screen to be bent into a convex surface, the display device 100 is configured to also enable the display screen to be bent into a concave surface.

Figure 2:
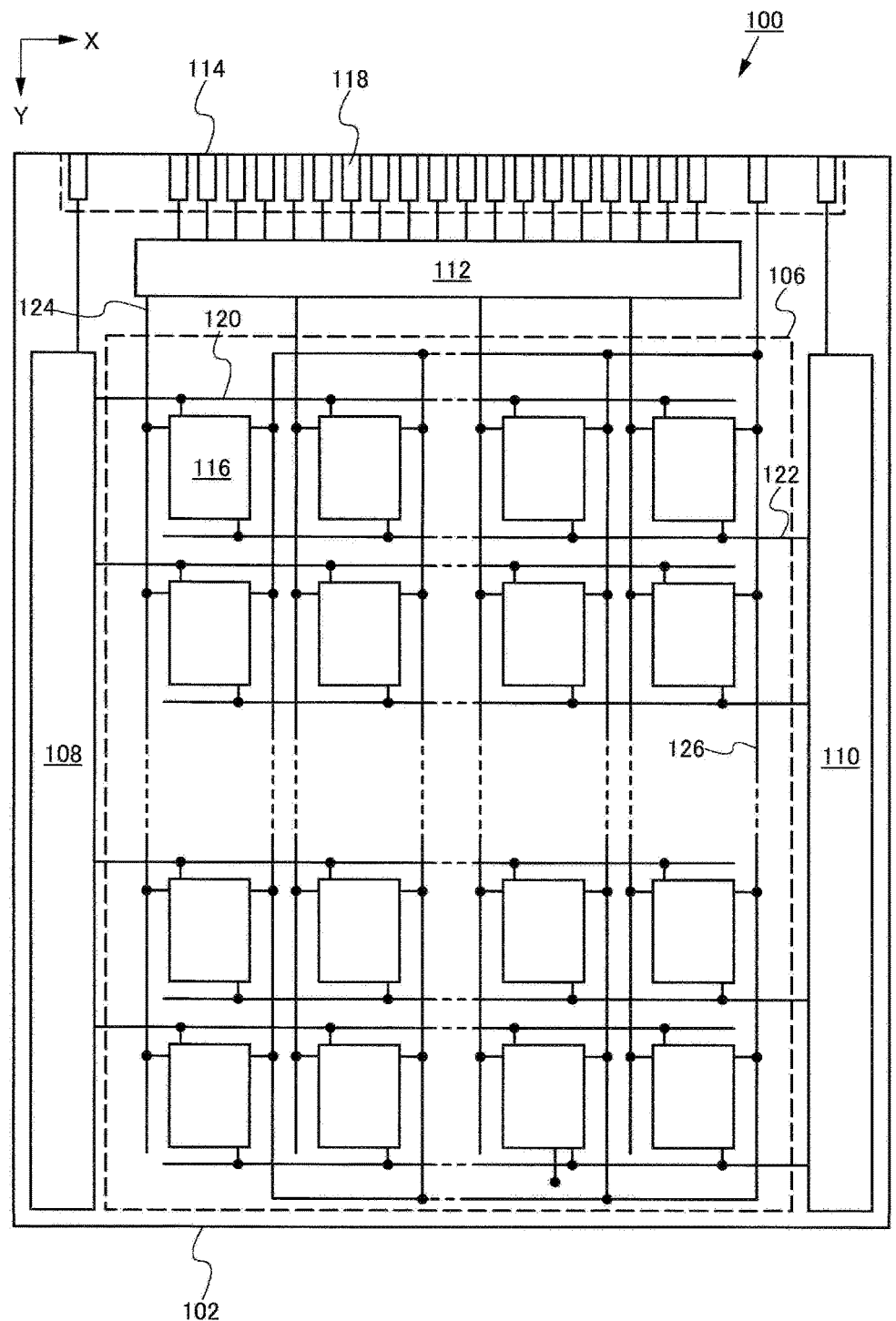
FIG. 2 is a diagram showing a configuration of the display device according to the embodiment of the present invention.

FIG. 2 shows a circuit configuration of such a display device 100. The display device 100 includes the pixel unit 106, in which the pixels 116 are arranged, a first drive circuit 108, a second drive circuit 110, a third drive circuit 112, and a terminal unit 114 including a plurality of terminals 118. Each of these components is provided over the flexible first substrate 102. The embodiment of the present invention assumes that the pixels 116 are provided with light-emitting elements as display elements. It should be noted that the display elements are not limited to the light-emitting elements but may be other types of elements that are used for displaying images. For example, the display elements may be liquid crystal elements based on the electrooptic effect of liquid crystals or electrochromic elements.

The pixel unit 106 includes first gate wirings 120, second gate wirings 122, and data wirings 124. The first gate wirings 120 and the second gate wirings 122 extend in a row-wise direction (i.e. an X direction shown in FIG. 2), and the data wirings 124 extend in a column-wise direction (i.e. a Y direction shown in FIG. 2). Further, the pixel unit 106 includes first power source lines 126 via which electric power is supplied to the light-emitting elements of the pixels 116. The first drive circuit 108 outputs signals to the first gate wirings 120. The second drive circuit 110 outputs signals to the second gate wirings 122. The third drive circuit 112 outputs signals to the data wirings 124. The terminal unit 114 receives signals that drive the display device 100.

It should be noted that although FIG. 2 shows an example where the pixels 116 are squarely arranged in rows and columns, the embodiment of the present invention is not limited to this example. For example, the pixels 116 may be arranged in another arrangement such as a delta arrangement or a Pen Tile arrangement. Further, such components of the display device 100 as the driving circuits, the signal lines, and the power source lines may be modified as appropriate.

Figure 3:
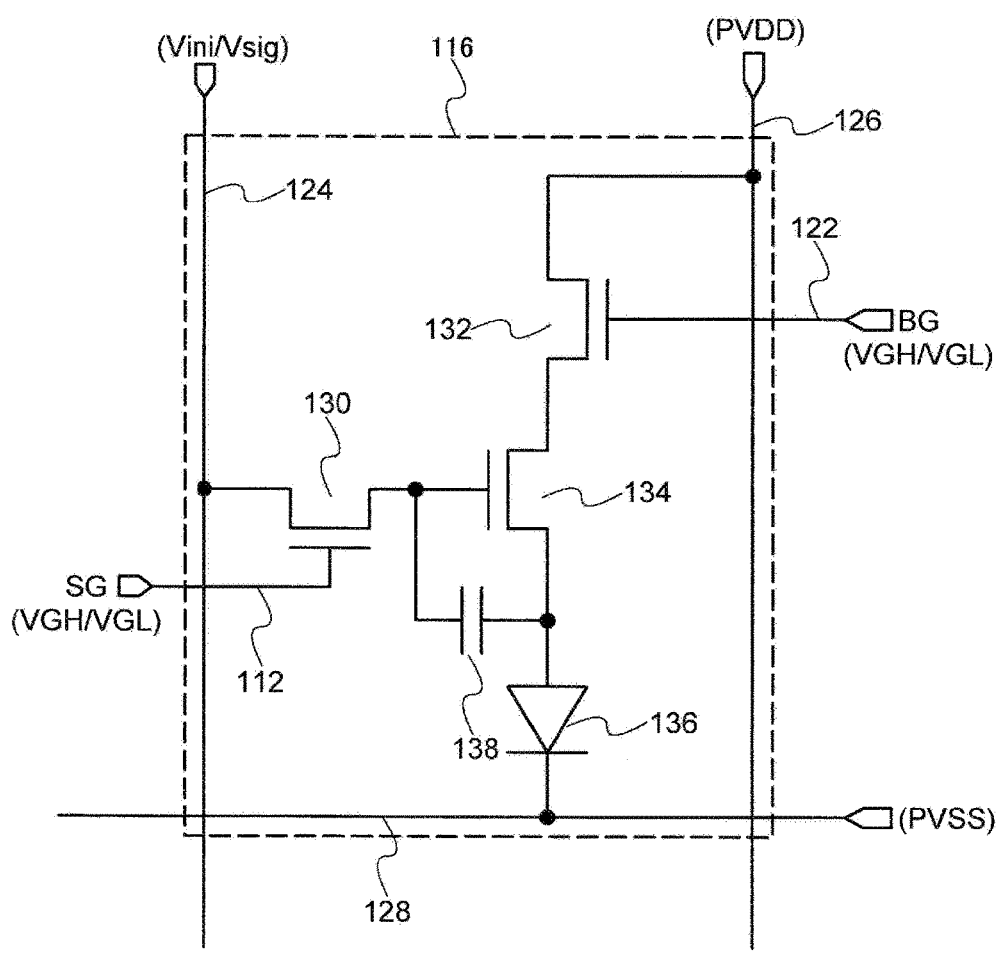
FIG. 3 is a diagram showing an equivalent circuit of a pixel of the display device according to the embodiment of the present invention.

FIG. 3 shows an example of a circuit configuration (pixel circuit) of each of the pixels 116. The pixel circuit includes a first transistor 130, a second transistor 132, a drive transistor 134, a light-emitting element 136, and a retentive capacitive element 138. The drive transistor 134 includes the following terminals: a gate that serves as a control terminal and a source and a drain that serve as input and output terminals. For example, in FIG. 3, the drain of the drive transistor 134 is electrically connected to the corresponding one of the first power source lines 126 via the second transistor 132, and the source of the drive transistor 134 is electrically connected to a first terminal of the light-emitting element 136. The light-emitting element 136 has its first terminal connected to the first power source line 126 via the drive transistor 134 and the second transistor 132 and its second terminal connected to the corresponding second power source line 128. The first power source line 126 is supplied with a high potential (PVDD), and the second power source line 128 is supplied with a low potential (PVSS).

The gate of the drive transistor 134 is electrically connected to the corresponding one of the data wirings 124 via the first transistor 130. The operation of turning on and turning off the first transistor 130 is controlled in accordance with a control signal SG (having amplitude VGH/VGL) that is supplied to the corresponding one of the first gate wirings 120. The first transistor 130 is controlled to be on by a high-potential control signal VGH and controlled to be off by a low-potential control signal VGL. When the first transistor 130 is on, an electric potential based on a data signal from the data wiring 124 is supplied to the gate of the drive transistor 134. Similarly, the operation of turning on and turning off the second transistor 132 is controlled in accordance with a control signal BG (having amplitude VGH/VGL) that is supplied to the corresponding one of the second gate wirings 122.

The retentive capacitive element 138 is provided between the source and gate of the drive transistor 134. The retentive capacitive element 138 retains a gate voltage of the drive transistor 134. The emission intensity of the light-emitting element 136 is controlled by a drain current of the drive transistor 134. The electric potential based on the data signal is supplied to the gate of the drive transistor 134, and when the second transistor 132 is turned on, an electric current flow to the light-emitting element 136. This causes the light-emitting element 136 to emit light.

Figure 4:
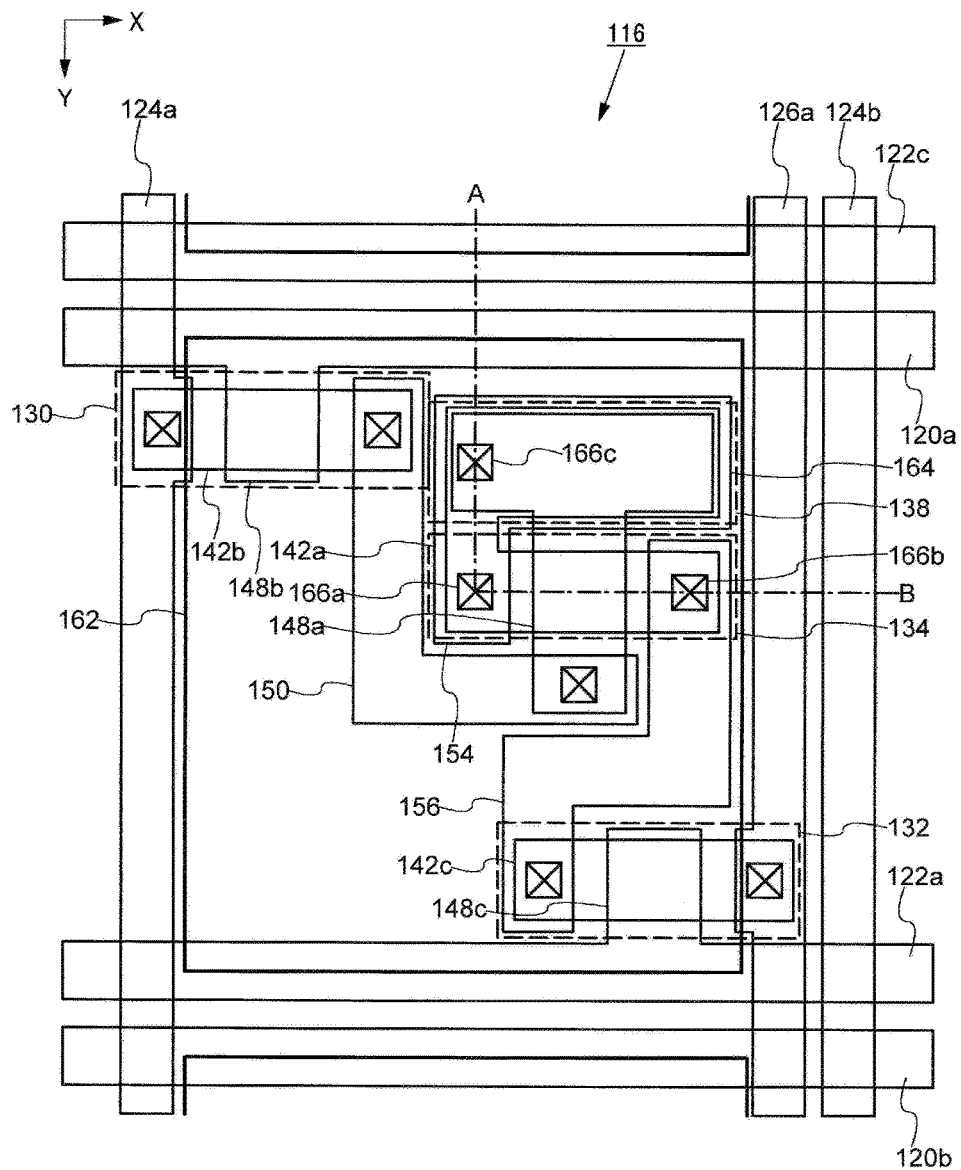
FIG. 4 is a plan view showing a layout of the pixel of the display device according to the embodiment of the present invention.

FIG. 4 shows an arrangement of the first transistor 130, the second transistor 132, the drive transistor 134, the light-emitting element 136, the retentive capacitive element 138, the first gate wiring 120, the second gate wiring 122, the data wiring 124, and the first power source line 126 in the pixel 116.

The drive transistor 134 includes a semiconductor layer 142a and a gate electrode 148a. The semiconductor layer 142a has a source region connected to a source wiring 154 through a first contact hole 166a and a drain region connected to a drain wiring 156 through a second contact hole 166b. The source wiring 154 is connected to a pixel electrode 162 through a third contact hole 166c. The first transistor 130 includes a semiconductor layer 142b and a gate electrode 148b, and the gate electrode 148b is connected to a first gate wiring 120a extending in a first direction (i.e. an X direction shown in FIG. 4). One of the input and output terminals, which correspond to the source and the drain, of the first transistor 130 is connected to a data wiring 124a extending in a second direction (i.e. a Y direction shown in FIG. 4) intersecting the first direction, and the other of the input and output terminals is connected to a gate wiring 150 connected to the gate electrode 148a of the drive transistor 134. The second transistor 132 includes a semiconductor layer 142c and a gate electrode 148c, and the gate electrode 148c is connected to a second gate wiring 122a extending in the first direction (i.e. the X direction shown in FIG. 4). One of the input and output terminals, which correspond to the source and the drain, of the second transistor 132 is connected to a first power source line 126a extending in the second direction (i.e. the Y direction shown in FIG. 4) intersecting the first direction, and the other of the input and output terminals is connected to the drain wiring 156 connected to the drain of the drive transistor 134. The retentive capacitive element 138 is formed in a region where the semiconductor layer 142a overlaps a retentive capacitive electrode 164. It should be noted that FIG. 4 omits to illustrate the gate insulating layer, the interlayer insulating layer, or the like.

As shown in FIG. 1, the display device 100 according to the embodiment of the present invention enables a region including the display screen to be bent. Moreover, the display device 100 includes a structure that prevents a decrease in reliability even in a case where the pixel unit 106 is bent. The structure is described in detail below.

First Embodiment

Figure 5:
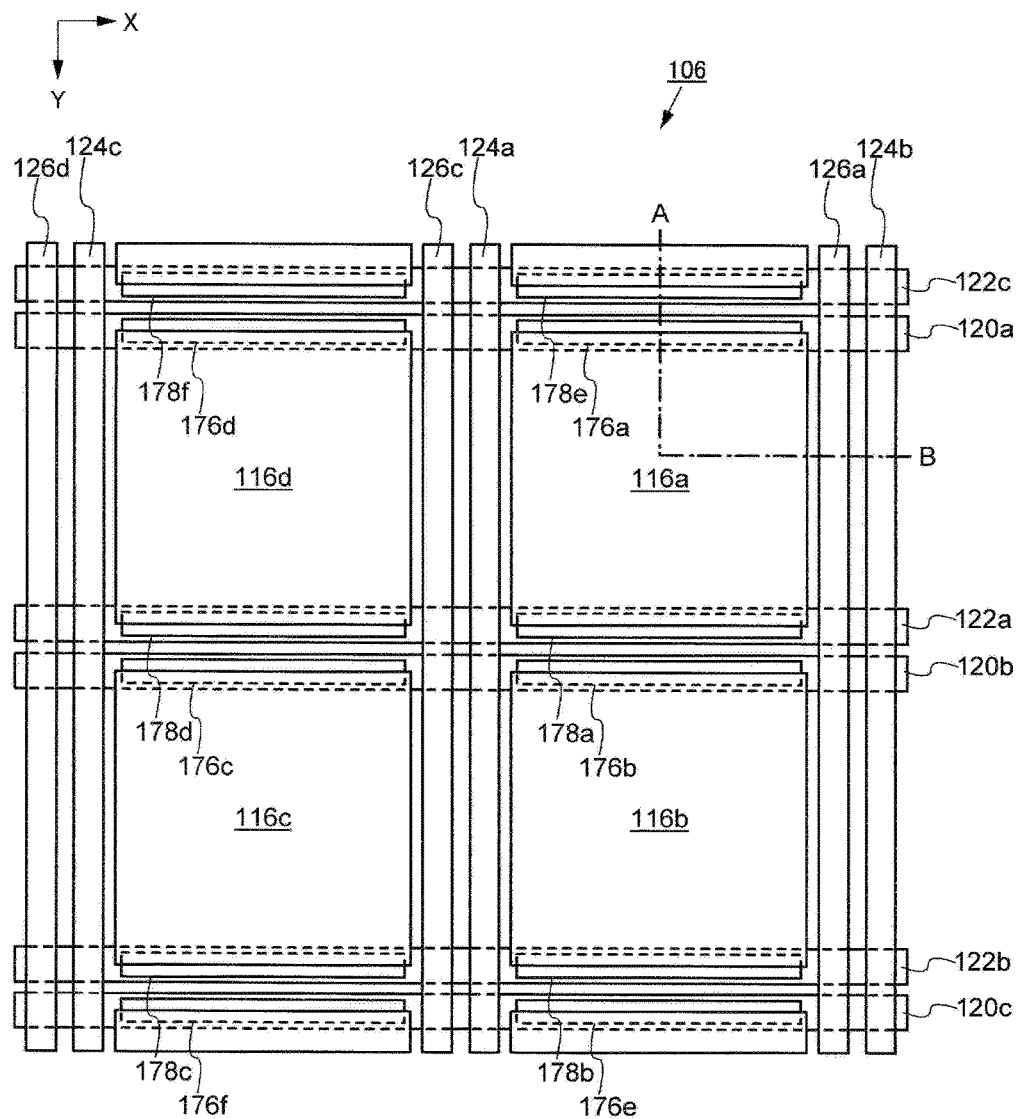
FIG. 5 is a plan view showing a configuration of a pixel unit of the display device according to the embodiment of the present invention.

The present embodiment exemplifies a structure of a display device that is bendable in at least one direction. FIG. 5 shows an aspect in which pixels 116 configured as shown in FIG. 4 are arranged in the pixel unit 106. FIG. 5 shows a first pixel 116a, a second pixel 116b, a third pixel 116c, a fourth pixel 116d, first gate wirings 120a, 120b, and 120c extending in a first direction (i.e. an X direction shown in FIG. 5), second gate wirings 122a, 122b, and 122c extending in the first direction, data wirings 124a, 124b, and 124c extending in a second direction (i.e. a Y direction shown in FIG. 5) intersecting the first direction, and first power source lines 126a, 126d, and 126c extending in the second direction. That is, in the pixel unit 106, the first gate wirings 120 and the second gate wirings 122 extend along the direction in which the first pixel 116a and the fourth pixel 116d are arranged, and the data wirings 124 and the first power source lines 126 extend in the direction in which the first pixel 116a and the second pixel 116b are arranged.

Although not clearly shown in FIG. 5, a first insulating layer made of an inorganic insulating material is provided between the first gate wirings 120a and 120b and the data wirings 124a and 124b, between the first gate wirings 120a and 120b and the first power source lines 126a and 126b, between the second gate wirings 122a and 122b and the data wirings 124a and 124b, and between the second gate wirings 122a and 122b and the first power source lines 126a and 126b. Moreover, the first insulating layer is provided with first openings 176a to 176f through which parts of the upper surfaces of the first gate wirings 120a, 120b, and 120c are exposed. Further, the first insulating layer is provided with second openings 178a to 178f through which parts of the upper surfaces of the second gate wirings 122a, 122b, and 122c are exposed.

Figure 6:
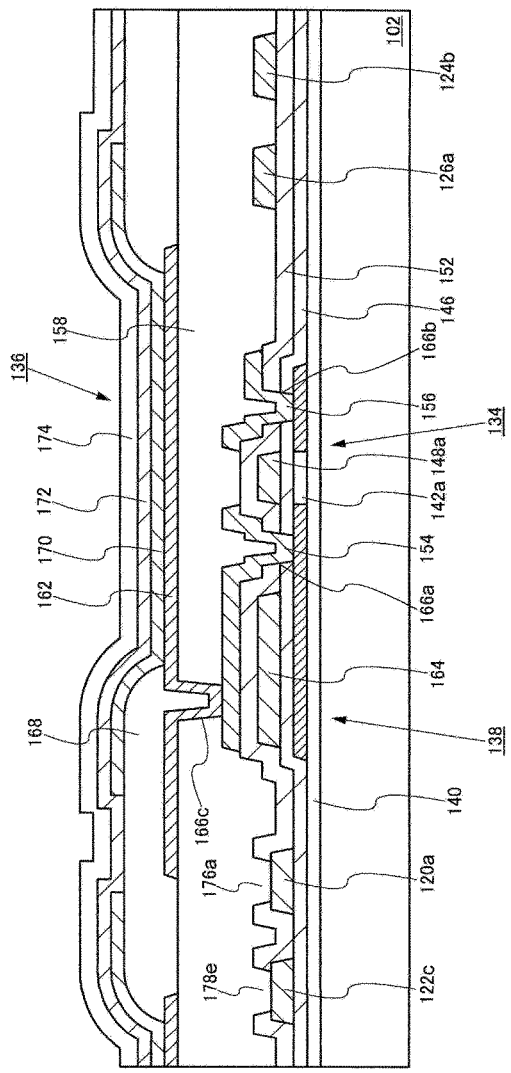
FIG. 6 is a cross-sectional view showing a structure of the pixel unit of the display device according to the embodiment of the present invention.

Next, FIG. 6 shows a cross-sectional structure taken along line A-B in FIG. 5. It should be noted that this line A-B corresponds to line A-B in the layout drawing of the pixel 116 shown in FIG. 4.

FIG. 6 shows cross-sectional structures of the drive transistor 134, the light-emitting element 136, and the retentive capacitive element 138. Further, FIG. 6 shows a cross-sectional structure of the first gate wiring 120a, the second gate wiring 122d, the first power source line 126a, and the data wiring 124b. These elements are provided over the first substrate 102.

It should be noted that the first substrate 102 is a flexible substrate. For example, the first substrate 102 is an organic resin film. A usable example of the organic resin film is a polyimide film. It is preferable that the polyimide film have a thickness of 1 to 100 µm, more preferably 1 to 50 µm. Although polyimide is merely an example of a substrate material, this material is superior in heat resistance, chemical resistance, and mechanical strength and, as such, is suitable as a substrate material for use in the present embodiment.

A foundation insulating layer 140 is provided on a first surface of the first substrate 102 on which the drive transistor 134 is provided. In the present embodiment, the foundation insulating layer 140 is not an essential component but functions as a barrier layer that prevents impurities from diffusing from the first substrate 102 side to the semiconductor layer 142 side.

The drive transistor 134 is constituted by the semiconductor layer 142a, a gate insulating layer 146, and the gate electrode 148a. The source region of the semiconductor layer 142a is connected to the source wiring 154, and the drain region of the semiconductor layer 142a is connected to the drain wiring 156. A first insulating layer 152 is provided between the gate electrode 148a and the source wiring 154 and between the gate electrode 148a and the drain wiring 156. The source wiring 154 is in contact with the source region of the semiconductor layer 142a via the first contact hole 166a formed in the first insulating layer 152, and the drain wiring 156 is in contact with the drain region of the semiconductor layer 142a via the second contact hole 166b formed in the first insulating layer 152.

A second insulating layer 158 is provided over the first insulating layer 152. A pixel electrode 162 is provided over the second insulating layer 158. The second insulating layer 158 serves as a foundation surface for the pixel electrode 162 and is used as a planarization film that planarizes this foundation surface. The source wiring 154 and the pixel electrode 162 are connected to each other via the third contact hole 166c formed in the second insulating layer 158.

In the present embodiment, each of the semiconductor layers 142 is made of any of various semiconductor materials. For example, each of the semiconductor layers 142 may be made of a silicon semiconductor or, more specifically, made of a polycrystalline silicon film or an amorphous silicon film. Alternatively, each of the semiconductor layers 142 may be made of a metal oxide (e.g. also referred to as "oxide semiconductor") having semiconducting properties. The gate electrode 148a and the gate wiring 120a are made of a metal material such as aluminum, titanium, molybdenum, or tungsten and, for example, have a structure in which titanium and aluminum are stacked. The first insulating layer 152 is made of an inorganic insulating material and, for example, is a silicon nitride film or a laminate of a silicon nitride film and a silicon oxide film. The second insulating layer 158 is made of an organic insulating material and, for example, is made of a resin material such as polyimide or acrylic. Further, the foundation insulating layer 140 has a structure in which silicon oxide and silicon nitride are stacked and, for example, has a structure in which a silicon nitride film is sandwiched between upper and lower silicon oxide films.

The pixel electrode 162 has its outer edges surrounded by an insulating layer called a bank layer 168. The bank layer 168 covers the edges of the pixel electrode 162 and the third contact hole 166c. The light-emitting element 136 is constituted by the pixel electrode 162, an organic layer 170, and a counter electrode 172. The light-emitting element 136 has a sealing layer 174 provided as the upper surface thereof. The sealing layer 174 includes a silicon nitride film that is not permeable to moisture or the like. Although not illustrated in FIG. 6, the second substrate 104 is provided on a higher level than the sealing layer 174.

The organic layer 170 is constituted by one or more layers and at least partially contains an organic electroluminescence material. The light-emitting element 136 emits light when a voltage that is equal to or higher than an emission threshold voltage is applied between the pixel electrode 162 and the counter electrode 172. In the present embodiment, the pixel electrode 162 is configured such that the light emitted by the organic layer 170 is reflected by a laminate structure of a transparent conductive film and a metal film. For example, the pixel electrode 162 includes at least two transparent conductive films and a metal film (preferably made of a high-reflectance material such as silver (Ag) or aluminum (Al)) sandwiched between the two transparent conductive films. The counter electrode 172 is formed by a transparent conductive film. The light emitted by the organic layer 170 is emitted from the counter electrode 172 side.

The retentive capacitive element 138 has a structure in which the first insulating layer 152 and the source wiring 154 overlap the retentive capacitive electrode 164. The retentive capacitive electrode 164 is formed by the same layer as the gate electrode 148a.

In FIG. 6, the first insulating layer 152 is provided with a first opening 176a through which the upper surface of the first gate wiring 120a is exposed and a second opening 178e through which the upper surface of the second gate wiring 122c is exposed. That is, the first insulating layer 152 has regions from which those portions of the first insulating layer 152 which overlap the parts of the upper surfaces of the gate wirings (first gate wiring 120a, second gate wiring 122c) have been removed. However, the first insulating layer 152 is provided not to expose all of the gate wirings (first gate wiring 120a, second gate wiring 122c) located on a lower level than the first insulating layer 152 but to cover at least the side surfaces of the gate wirings (first gate wiring 120a, second gate wiring 122c).

Such first openings 176 and second openings 178 can be formed at the same time as the first contact hole 166a and the second contact hole 166b are formed in the first insulating layer 152. This eliminates the need to increase the number of steps to form the first openings 176 and the second openings 178 in the first insulating layer 152.

The first openings 176 and the second openings 178 each have a long, narrow opening shape along the direction in which the first gate wirings 120 and the second gate wirings 122 extend. In other words, the first insulating layer 152 is provided with first openings 176 and second openings 178 that are rectangular in shape along one side of the pixel electrode 162. Of course, the first openings 176 and the second openings 178 are not provided in regions where the first gate wirings 120 and the second gate wirings 122 intersect the data wirings 124 and the first power source lines 126.

Since the first insulating layer 152 is made of an inorganic insulating films such as a silicon oxide film or a silicon nitride film, it is brittle. Therefore, bending the first substrate 102 to a certain curvature or larger cracks the first insulating layer 152. Further, the provision of the gate wirings causes stepped portions to be present on a lower level than the first insulating layer 152. By being provided to cover these stepped portions, the first insulating layer 152 is placed in a situation where bending the first substrate 102 causes stress to be easily concentrated on regions covering these stepped portions. That is, it can be said that stress is easily concentrated on those portions of the first insulating layer 152 which cover the first gate wirings 120 and the second gate wirings 122 and that the first insulating layer 152 is easily cracked by bending the first substrate 102. Meanwhile, since the first gate wirings 120 and the second gate wirings 122 are metal films, they have plasticity and have resistance to the bending of the first substrate 102.

The present embodiment prevents the occurrence of cracks by being structured to relax the bending stress on the first insulating layer 152 by providing the first openings 176 and the second openings 178 in regions where the first insulating layer 152 overlaps the first gate wirings 120 and the second gate wirings 122. That is, by providing openings (or notches) in regions in the first insulating layer 152 that overlap the gate wirings where stress is considered to be concentrated, the bending stress is prevented from being concentrated on a particular part of the first insulating layer 152.

Furthermore, the first and second openings 176 and 178 provided in the first insulating layer 152 are filled with the organic insulating material forming the second insulating layer 158. By thus filling, with the organic insulating material forming the second insulating layer 158, the regions from which the first insulating layer 152 has been removed, the first insulating layer 152 is prevented from being cracked when the first substrate 102 is bent.

By being structured such that the inorganic insulating layer covering the gate wirings are provided with the openings through which the upper surfaces of the gate wirings are exposed and the openings are filled with the organic insulating layer stacked on the inorganic insulating layer, the present embodiment allows this site to function as a stress relaxation region. This site is hereinafter also referred to as "stress relaxation region". In a case where the display device 100 is bent as shown in FIG. 1, it is preferable that such a stress relaxation region be provided in the bent part.

In the present embodiment, by the openings (first openings 176, second openings 178) being provided in the first insulating layer 152 in such a way as to extend in a direction along the gate wirings (first gate wirings 120, second gate wirings 122), a display device can be provided which is easily bent in a direction parallel to this direction by the action of the stress relaxation region.

It should be noted that the first insulating layer 152 is used as a protective film for the drive transistor 134 and the like. That is, the first insulating layer 152 functions as a blocking layer that prevents moisture and the like from permeating the semiconductor layers 142. Nevertheless, since the first insulating layer 152 is provided with the first openings 176 and the second openings 178, there is concern that the function of the first insulating layer 152 as a blocking layer may be impaired. However, the metal layer forming the gate wirings are in general low in moisture vapor transmission rate and has the property of preventing permeation of moisture or the like. By providing the first insulating layer 152 with the first and second openings 176 and 178 over the first and second gate wirings 120 and 122, respectively, the present embodiment prevents the function of the first insulating layer 152 as a blocking layer from being impaired.

As a specific configuration, by the first insulating layer 152 including at least one silicon nitride layer, the function of the first insulating layer 152 as a barrier layer that prevents permeation of impurities such as moisture is enhanced. Further, the metal film of aluminum, titanium, molybdenum, or the like that is used as the first gate wirings 120 and the second gate wirings 122 has barrier properties against moisture and the like. For this reason, although the first insulating layer 152 is provided with the first openings 176, the function of the first insulating layer 152 as a barrier layer can be maintained by providing the first openings 176 so that the first openings 176 overlap the parts of the upper surfaces of the first gate wirings 120.

That is, a sealed structure that prevents permeation of impurities such as moisture can be formed by setting the first openings 176 narrower in width than the first gate wirings 120 and covering the side surfaces and upper end faces of the first gate wirings 120 with the first insulating layer 152. This allows the semiconductor layer 142a of the drive transistor 134 to have its upper surface covered with the sealing structure formed by the first insulating layer 152, the first gate wirings 120, and the second gate wirings 122 and its lower surface covered with the foundation insulating layer 140 including a silicon nitride film, thus making it possible to prevent permeation of impurities such as moisture and thereby prevent a decrease in reliability.

Figure 7:
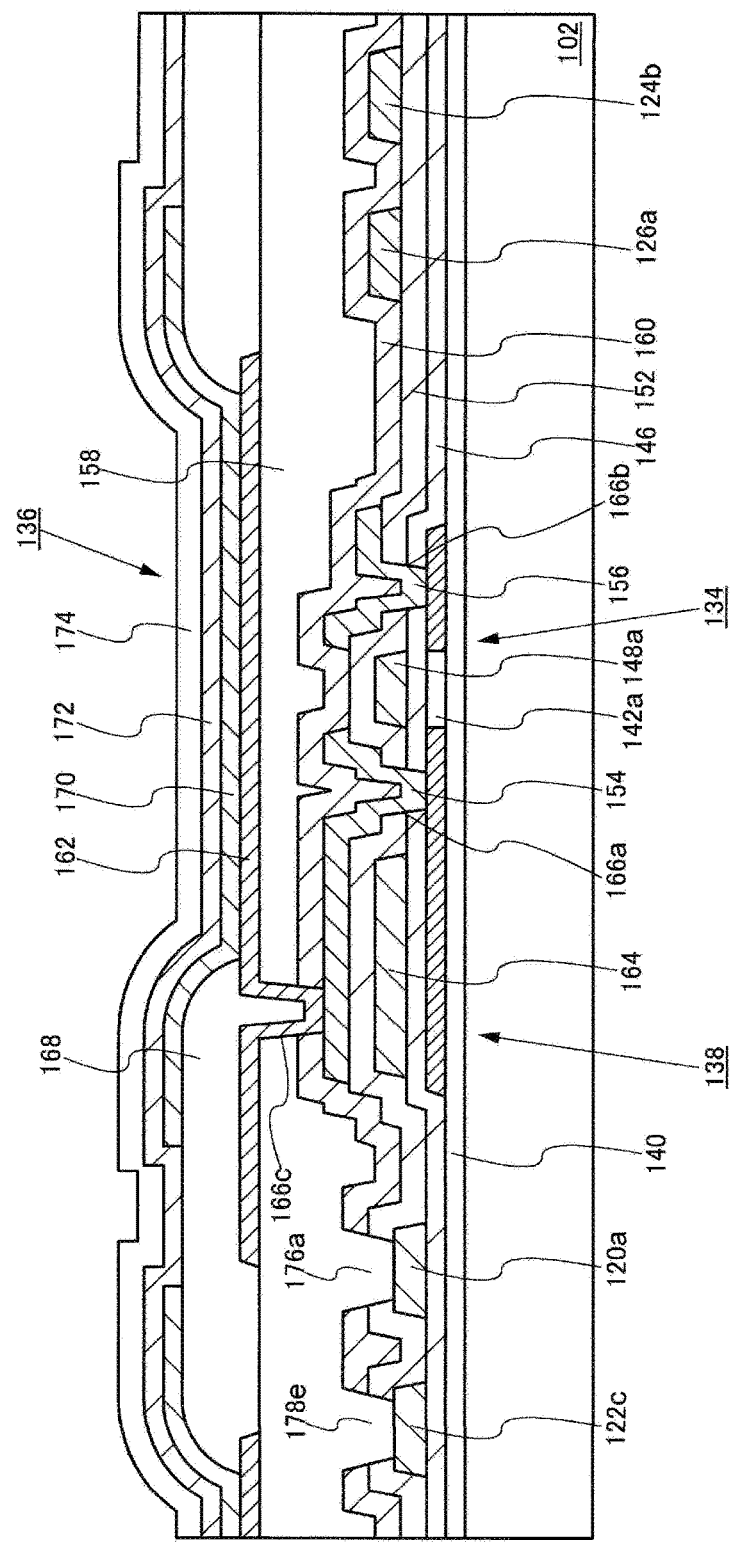
FIG. 7 is a cross-sectional view showing a structure of the pixel unit of the display device according to the embodiment of the present invention.

It should be noted that, as shown in FIG. 7, the first opening 176a and the second opening 178e can be similarly provided also in a case where a third insulating layer 160 formed by an inorganic insulating layer is provided between the first insulating layer 152 and the second insulating layer 158. As with the first insulating layer 152, the third insulating layer 160 is provided by a silicon oxide film, a silicon nitride film, or a laminate of a silicon nitride film and a silicon oxide film. In this case, the first insulating layer 152 and the second insulating layer 158 are stacked over the first gate wirings 120 and the second gate wirings 122, the first opening 176a and the second opening 178e are provided in such a way as to penetrate these two insulating layers.

Thus, the present embodiment provides a display device that is easily bent in at least the direction in which the gate wirings extend. Moreover, since the first insulating layer can be prevented from being cracked even when the display device is bent, a decrease in reliability can be prevented.

Second Embodiment

Figure 8:
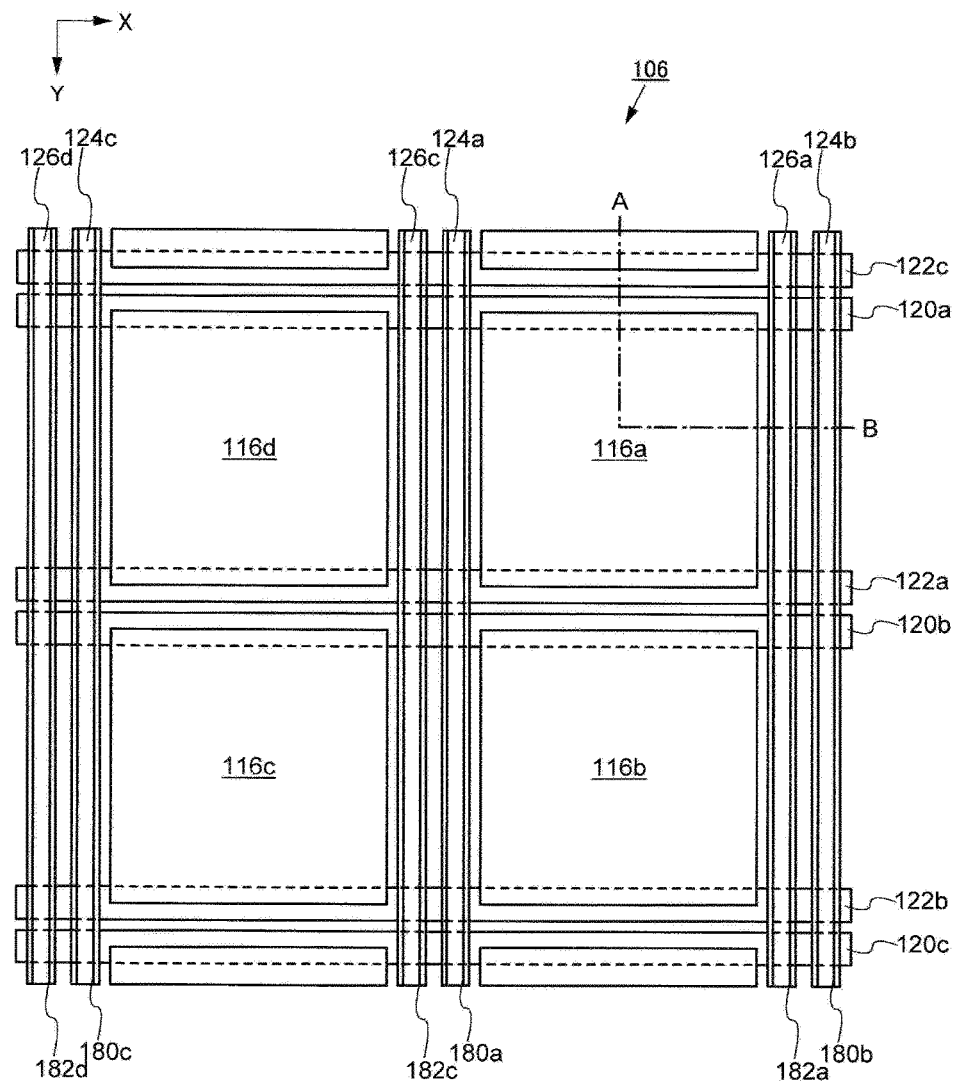
FIG. 8 is a plan view showing a configuration of a pixel unit of a display device according to an embodiment of the present invention.
Figure 9:
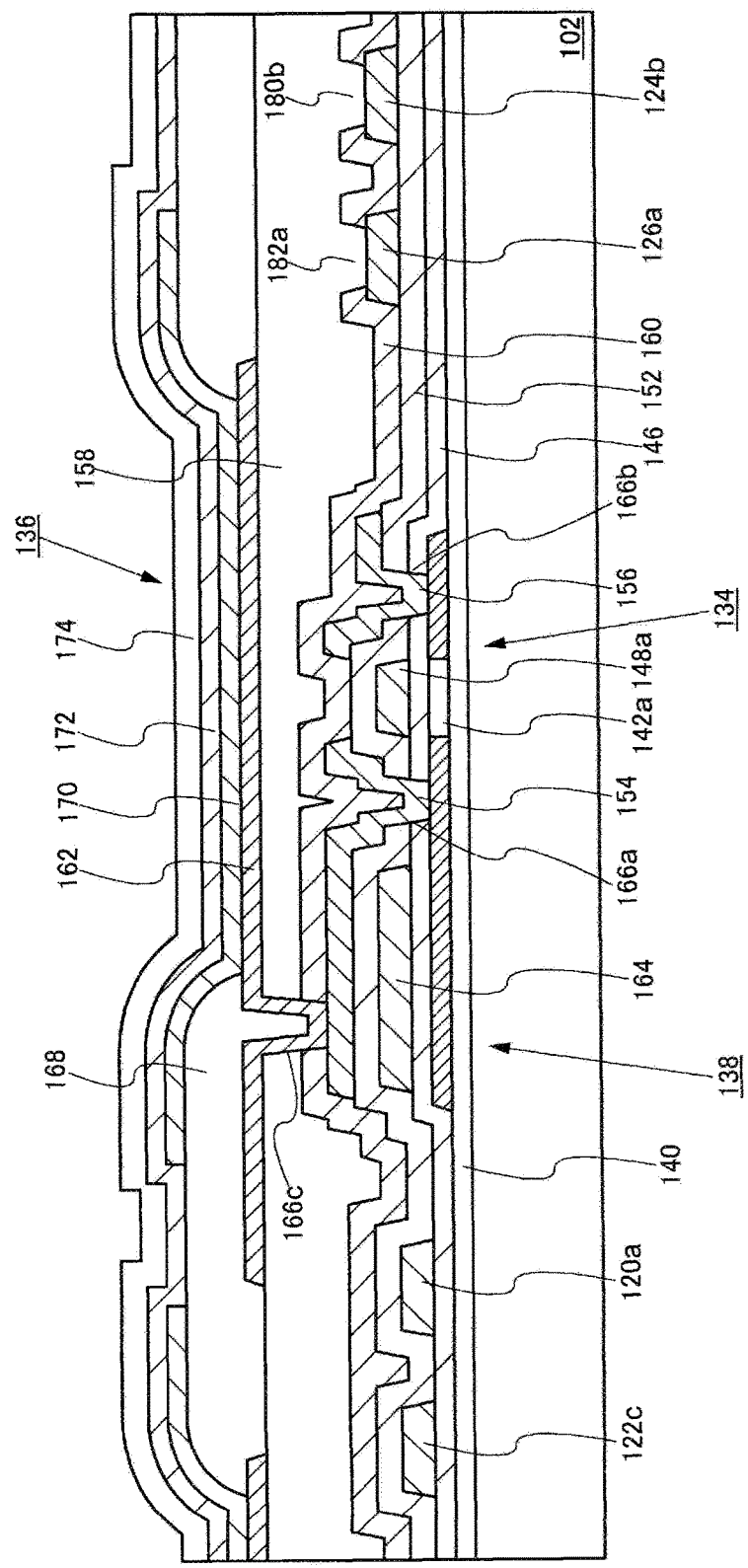
FIG. 9 is a cross-sectional view showing a structure of the pixel unit of the display device according to the embodiment of the present invention.

The present embodiment shows examples of openings in the first insulating layer that are different from those shown in the first embodiment. FIG. 8 shows an aspect in which such pixels 116 as that shown in FIG. 4 are arranged in the pixel unit 106. Further, FIG. 9 is a cross-sectional view of a pixel as taken along line A-B in FIG. 8. The following description refers to FIG. 8 and FIG. 9. It should be noted that this line A-B corresponds to line A-B in the layout drawing of the pixel 116 shown in FIG. 4. The following describes parts that are different from those of the structure shown in FIG. 6.

In the present embodiment, the pixel unit 106 shown in FIG. 8 is provided with the third insulating layer 160 on a higher level than the data wirings 124a, 124b, and 124c and the first power source lines 126a, 126d, and 126c. Moreover, the third insulating layer 160 is provided with a third opening 180a in a position that overlaps the data wiring 124a, and is provided with a fourth opening 182a in a position that overlaps the first power source line 126a. The third opening 180a is bored in the direction in which the data wiring 124a extends, and the fourth opening 182a is bored in the direction in which the first power source line 126a extends. The shapes of such openings are the same as those of third openings 180b and 180c on the data wirings 124b and 124c and those of fourth openings 182c and 182d on the first power source lines 126c and 126d. The third openings 180 and the fourth openings 182 each have a long, narrow opening shape along the direction in which the data wirings 124 and the first power source lines 126 extend. In other words, the first insulating layer 152 is provided with third openings 180 and fourth openings 182 that are rectangular in shape along one side of the pixel electrode 162.

The pixel unit 106 shown in FIG. 9 is provided with the third insulating layer 160 over the data wiring 124c and the first power source line 126a, as well as the source wiring 154 and the drain wiring 156, which are formed by the same layer as the data wiring 124c and the first power source line 126a. As with the first insulating layer 152, the third insulating layer 160 is made of an inorganic insulating material. The third insulating layer 160, for example, has a silicon nitride film or a structure in which a silicon nitride film and a silicon oxide film are stacked. As with the first insulating layer 152, such a third insulating layer 160 functions as a protective film for the transistors.

The third insulating layer 160 is provided with the third opening 180b through which a part of the upper surface of the data wiring 124b is exposed and the fourth opening 182a through which a part of the upper surface of the first power source line 126a is exposed. That is, the third insulating layer 160 has removed regions on the parts of the upper surfaces of the data wiring 124b and the first power source line 126a. The third insulating layer 160 is provided in such a way as to cover the side surfaces and top edges of the data wiring 124b and the first power source line 126a.

As with the first insulating layer 152, the third insulating layer 160, which is an inorganic insulating film, is brittle. Therefore, bending the first substrate 102 to a certain curvature or large undesirably cracks the third insulating layer 160. Meanwhile, the data wirings 124 and the first power source lines 126 are formed by a metal film of titanium, molybdenum, aluminum, or the like (e.g. a structure in which an aluminum film is sandwiched between upper and lower titanium films) and, as such, have plasticity. Therefore, the data wirings 124 and the first power source lines 126 are not cracked even when the first substrate 102 is bent, and have resistance to bending. The present embodiment prevents the occurrence of cracks by being structured to relax the bending stress on the third insulating layer 160 by the third insulating layer 160 having the third openings 180 and the fourth openings 182 in regions that overlap the data wirings 124 and the first power source lines 126.

Furthermore, the third and fourth openings 180 and 182 provided in the third insulating layer 160 are filled with the organic insulating material forming the second insulating layer 158. By filling, with the organic insulating material forming the second insulating layer 158, the regions from which the third insulating layer 160 has been removed, the third insulating layer 160 is prevented from being cracked when the first substrate 102 is bent. By thus being structured such that the inorganic insulating layer covering the data wirings and the power source lines is provided with the openings and the openings are filled with the organic insulating layer, the present embodiment allows this site to function as a stress relaxation region.

In the present embodiment, by the openings (third openings 180, fourth openings 182) being provided in the third insulating layer 160 in such a way as to extend in a direction along the data wirings 124 (i.e. a Y direction shown in FIG. 8), a display device can be provided whose first substrate 102 is easily bent in a direction parallel to this direction by the action of the stress relaxation region.

Further, the openings provided in the third insulating layer 160 are formed to expose the parts of the upper surfaces of the data wirings 124 and the first power source lines 126 and cover at least the side surfaces of the data wirings 124 and the first power source lines 126, thereby preventing the function of the third insulating layer 160 as a protective film from being impaired. This allows the semiconductor layer 142a of the drive transistor 134 to have its upper surface covered with the first insulating layer 152 and the sealing structure formed by the third insulating layer 160, the data wirings 124, and the first power source lines 126 and its lower surface covered with the foundation insulating layer 140 and to be thereby protected from permeation of impurities such as moisture.

Thus, the present embodiment provides a display device that is easily bent in at least the direction in which the data wirings extend. Moreover, since the third insulating layer can be prevented from being cracked even when the display device is bent, a decrease in reliability can be prevented.

Third Embodiment

The present embodiment shows an example of a display device that can be bent along both gate wirings extending in a first direction and data wirings extending in a second direction intersecting the first direction.

Figure 10:
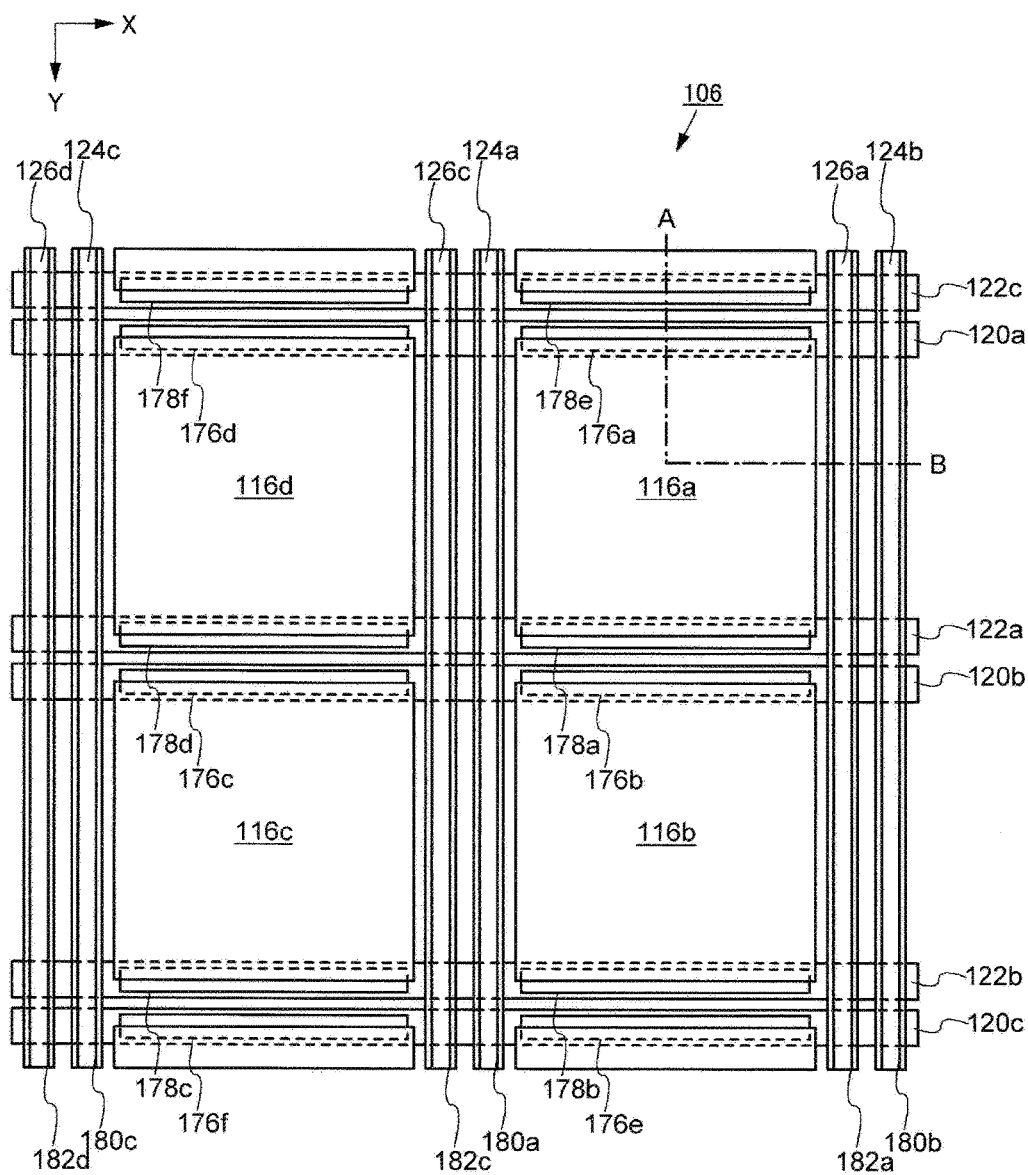
FIG. 10 is a plan view showing a configuration of a pixel unit of a display device according to an embodiment of the present invention.
Figure 11:
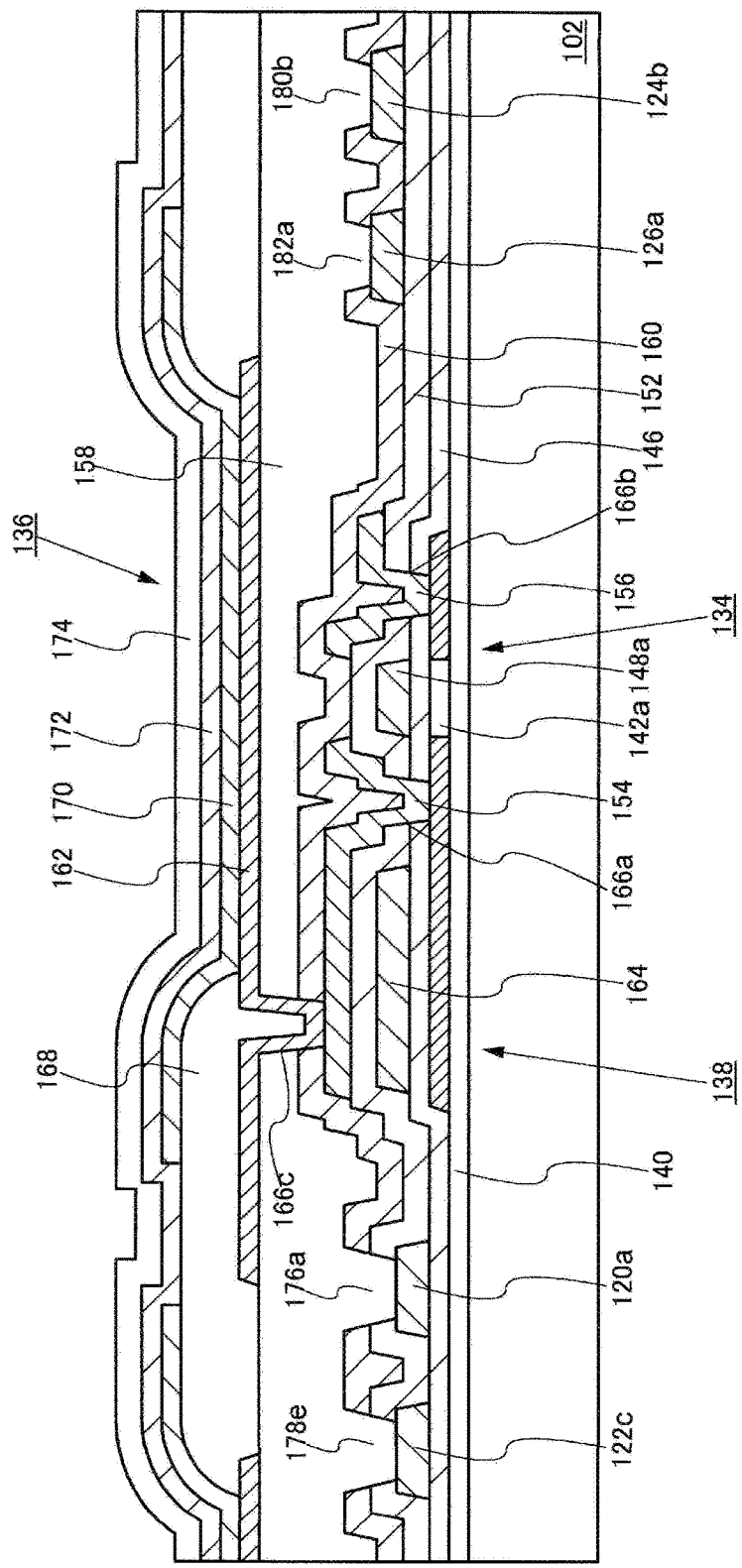
FIG. 11 is a cross-sectional view showing a structure of the pixel unit of the display device according to the embodiment of the present invention.

FIG. 10 shows an aspect in which such pixels 116 as that shown in FIG. 4 are arranged in the pixel unit 106. Further, FIG. 11 is a cross-sectional view of a pixel as taken along line A-B in FIG. 10. The following description refers to FIG. 10 and FIG. 11. It should be noted that this line A-B corresponds to line A-B in the layout drawing of the pixel 116 shown in FIG. 4. The following describes parts that are different from those of the structure shown in FIG. 6.

In the present embodiment, the pixel unit 106 shown in FIG. 10 is provided with a first insulating layer 152 made of an inorganic insulating material between the first gate wirings 120a and 120b and the data wirings 124a and 124b, between the first gate wirings 120a and 120b and the first power source lines 126a and 126c, between the second gate wirings 122a and 122b and the data wirings 124a and 124b, and between the second gate wirings 122a and 122b and the first power source lines 126a and 126c. Further, a third insulating layer 160 is provided over the first insulating layer 152. Moreover, the first insulating layer 152 and the third insulating layer 160 are provided with first openings 176a to 176f through which parts of the upper surfaces of the first gate wirings 120a, 120b, and 120c are exposed. Further, the first insulating layer 152 and the third insulating layer 160 are provided with second openings 178a to 178f through which parts of the upper surfaces of the second gate wirings 122a, 122b, and 122c are exposed.

Furthermore, the third insulating layer 160 is provided with a third opening 180a in a position that overlaps the data wiring 124a, and is provided with a fourth opening 182a in a position that overlaps the first power source line 126a. The third opening 180a and the fourth opening 182a extend in the directions in which the data wiring 124a and the first power source lines 126a extend, respectively. The same form applies to the third openings 180b and 180c on the data wirings 124b and 124c and the fourth openings 182c and 182d on the first power source lines 126c and 126d.

The configuration of the first opening 176a and the second opening 178e in the first insulating layer 152 as well as the third opening 180b and the fourth opening 182a in the third insulating layer 160 is the same as those shown in the first and second embodiments. This makes it possible to provide a display device that is easily bent in both a case where it is bent in a direction along the gate wirings and a case where it is bent in a direction along the data wirings.

Fourth Embodiment

Figure 12:
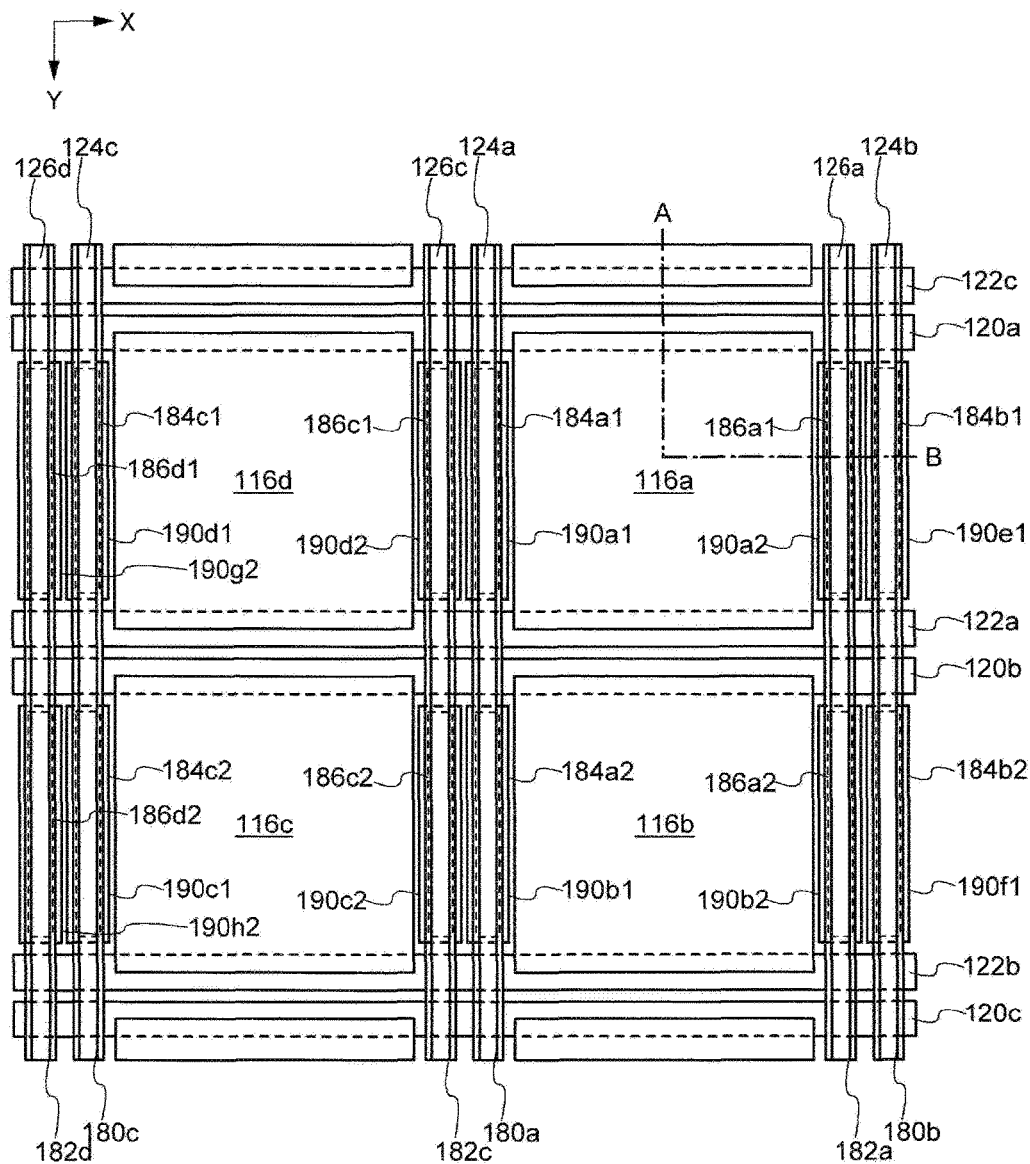
FIG. 12 is a plan view showing a configuration of a pixel unit of a display device according to an embodiment of the present invention.

The present embodiment shows a configuration in which those portions of the first insulating layer 152 that were present on a lower level than the data wirings 124 and the first power source lines 126 are removed from the configuration of the third openings 180 on the data wirings 124 and in the third insulating layer 160 and the configuration of the fourth openings 182 on the first power source lines 126 and in the third insulating layer 160 in the second embodiment. The following describes parts that are different from those of the second embodiment with reference to FIG. 12 and FIG. 13. FIG. 12 is an arrangement plan of pixels, and FIG. 13 is a cross-sectional view taken along line A-B.

Although not illustrated, the pixel unit 106 shown in FIG. 12 is provided with a first insulating layer 152 and a third insulating layer 160. The third insulating layer 160 is provided with third openings 180a to 180c through which parts of the upper surfaces of the data wirings 124a to 124c are exposed and fourth openings 182a, 182c, and 182d through which parts of the upper surfaces of the first power source lines 126 are exposed. This configuration is the same as that described in the second embodiment. On one hand, in the second embodiment, those portions of the first insulating layer 152 that are disposed on a lower level than the data wirings 124 and the first power source lines 126 remain. On the other hand, in the present embodiment, the first insulating layer 152 is provided with fifth openings 184a1 to 184c2 in regions that overlap the data wirings 124a to 124c, and is provided with sixth openings 186a1, 186a2, 186c1, 186c2, 186d1, and 186d2 in regions that overlap the first power source lines 126a, 126c, and 126d. The fifth openings 184a1 to 184c2 and the sixth openings 186a1, 186a2, 186c1, 186c2, 186d1, and 186d2 are openings that penetrate the first insulating layer 152. It should be noted that, for insulation between wiring layers, the fifth openings 184a1 to 184c2 and the sixth openings 186a1, 186a2, 186c1, 186c2, 186d1, and 186d2 are not provided in regions that intersect the first gate wirings 120a to 120c and the second gate wirings 122a to 122c, although the fifth openings 184a1 to 184c2 and the sixth openings 186a1, 186a2, 186c1, 186c2, 186d1, and 186d2 are provided along the direction in which the data wirings 124a to 124c and the first power source lines 126a to 126c extend.

Moreover, the fifth openings 184a1 to 184c2 correspond to first metal patterns 190a1 to 190f1 provided on a lower level than the first insulating layer 152. Further, the sixth openings 186a1 to 186c2 correspond to second metal patterns 190a1 to 190f1. The data wirings 124a to 124c are in contact with the first metal patterns 190a1 to 190f1 through the fifth openings 184a1 to 184c2, respectively. Further, the first power source lines 126a, 126c, and 126d are in contact with the second metal patterns 190a1, 190a2, 190b1, 190b2, 190c1, 190c2, 190d1, 190d2, 190e1, 190f1, 190g2, and 190h2 through the sixth openings 186a1, 186a2, 186c1, 186c2, 186d1, and 186d2, respectively.

Figure 13:
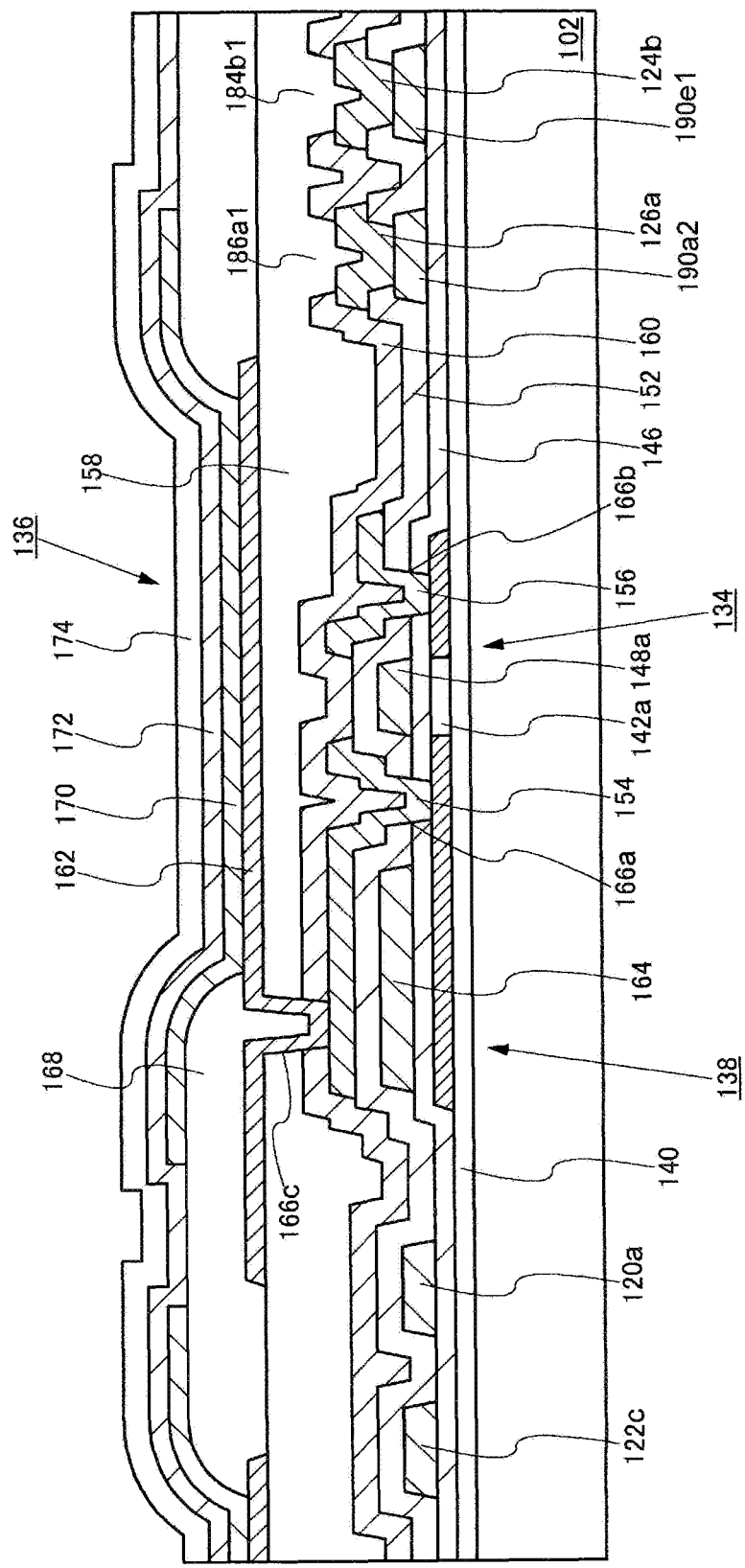
FIG. 13 is a cross-sectional view showing a structure of the pixel unit of the display device according to the embodiment of the present invention.

As shown in FIG. 13, the fifth opening 184b1 in the first insulating layer 152 is closed by the data wiring 124b, which is on a higher level than the first insulating layer 152, being depressed into the first metal pattern 190e1, which is on a lower level than the first insulating layer 152. Similarly, the sixth opening 186a1 in the first insulating layer 152 is closed by the first power source line 126a, which is on a higher level than the first insulating layer 152, being depressed into the second metal pattern 190e1, which is on a lower level than the first insulating layer 152. Thus, although the first insulating layer 152 is provided with the fifth openings 184 and the sixth openings 186, the first insulating layer 152 keeps functioning as a protective film for the semiconductor layers 142, as the fifth openings 184 are closed by the data wirings 124 and the first metal patterns 190 and the sixth openings 186 are closed by the first power source lines 126 and the second metal patterns 190.

The present embodiment allows stress relaxation regions to be provided along the data wirings 124 by a structure in which the third openings 180 and the fifth openings 184 are provided in the third insulating layer 160 and the first insulating layer 152, respectively, in such a way as to overlap each other, in which the data wirings 124 are further provided in these sites, and in which the first metal patterns 190 are further provided on a lower level than the data wirings 124. Further, the present embodiment allows stress relaxation regions to be provided along the first power source lines 126 by a structure in which the fourth openings 182 and the sixth openings 186 are provided in the third insulating layer 160 and the first insulating layer 152, respectively, in such a way as to overlap each other, in which the first power source lines 126 are further provided in these sites, and in which the second metal patterns 190 are further provided on a lower level than the first power source lines 126. This removes those portions of the first insulating layer 152 that are disposed on a lower level than the data wirings 124 and the first power source lines 126, thus achieving a stress relaxation structure with increased resistance to the bending of the first substrate 102.

The present embodiment makes it possible to provide a display device that is easily bent in a direction along the data wirings 124 or the first power source lines 126. In this case, where the inorganic insulating layer on a lower level than the data wirings 124 is partially removed, the occurrence of cracks in the inorganic insulating layer can be more effectively prevented.

It should be noted that although the present embodiment shows an aspect in which the first insulating layer 152 is provided with the fifth openings 184 corresponding to the data wirings 124 and the sixth openings 186 corresponding to the first power source lines 126, the present invention is not limited to this aspect. For example, similar effects can be brought about by providing the first insulating layer 152 with a stress relaxation structure according to the present embodiment in either the data wirings 124 or the first power source lines 126.

Further, as with the third embodiment, the present embodiment allows the first insulating layer 152 to be further provided with first openings 176 through which the upper surfaces of the first gate wirings 120 are exposed and second openings 178 through which the upper surfaces of the second gate wirings 122 are exposed. This makes it possible to provide a display device that is easily bent in both a case where the first substrate 102 is bent in a direction along the gate wirings and a case where the first substrate 102 is bent in a direction along the data wirings.

Fifth Embodiment

The present embodiment exemplifies an example differing in the structure of wirings in each pixel 116 and the structure of openings through which an inorganic insulating layer is exposed.

Figure 14:
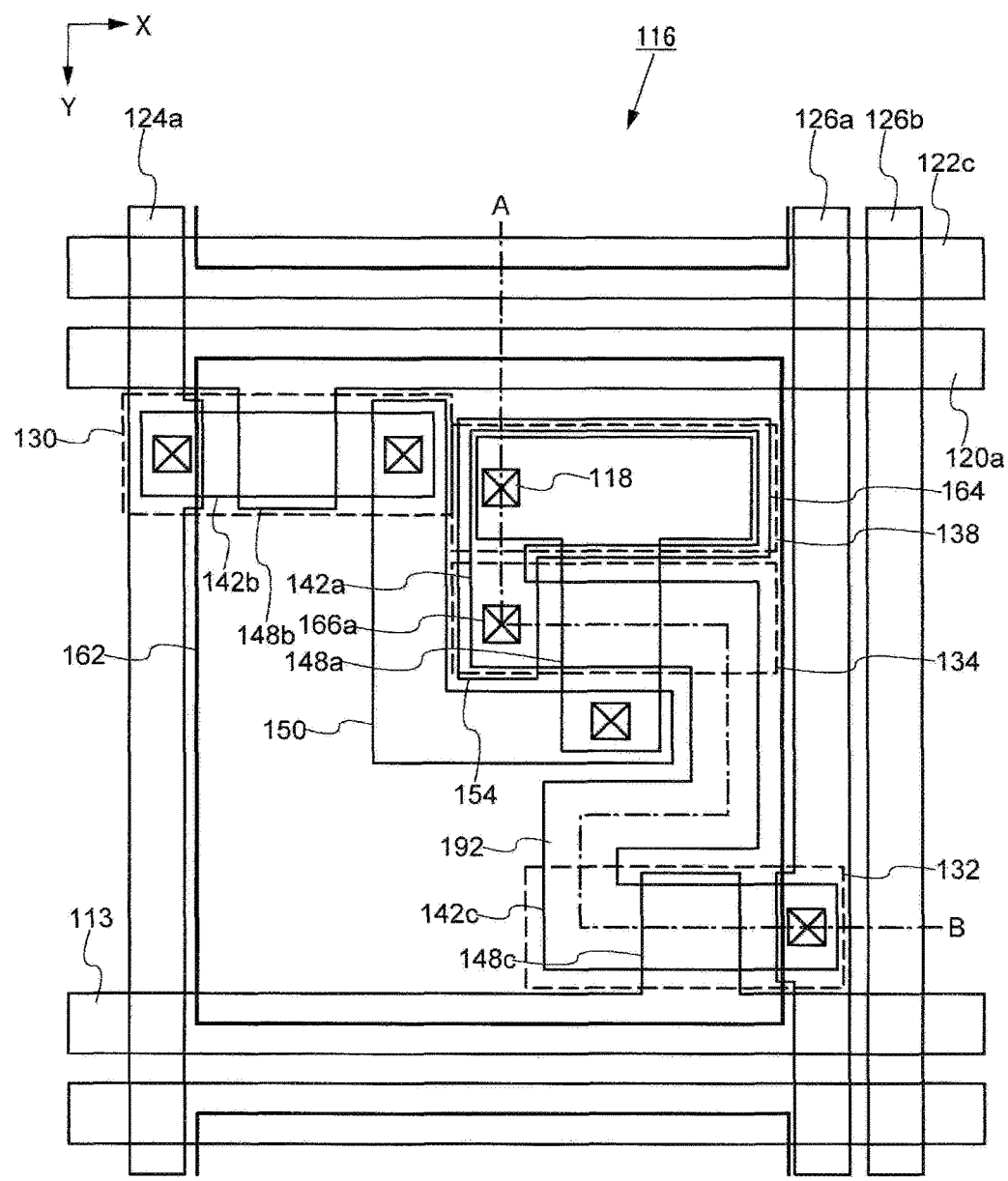
FIG. 14 is a plan view showing a layout of a pixel of a display device according to an embodiment of the present invention.

FIG. 14 shows an arrangement of the first transistor 130, the second transistor 132, the drive transistor 134, the light-emitting element 136, the retentive capacitive element 138, the first gate wiring 120, the second gate wiring 122, the data wiring 124, and the first power source line 126 in a pixel 116. The difference from the layout of the pixel shown in FIG. 4 lies in the structure of connection between the drive transistor 134 and the second transistor 132.

In FIG. 14, the semiconductor layer 142a of the drive transistor 134 and the semiconductor layer 142c of the second transistor 132 are provided as one continuous island-shaped semiconductor region. The semiconductor layer 142a of the drive transistor 134 and the semiconductor layer 142c of the second transistor 132 are coupled to each other in a semiconductor region made lower in resistance by being doped with the same impurities as the drain region. For this reason, this semiconductor region has the same function as the drain wiring 156 shown in FIG. 4.

Figure 15:
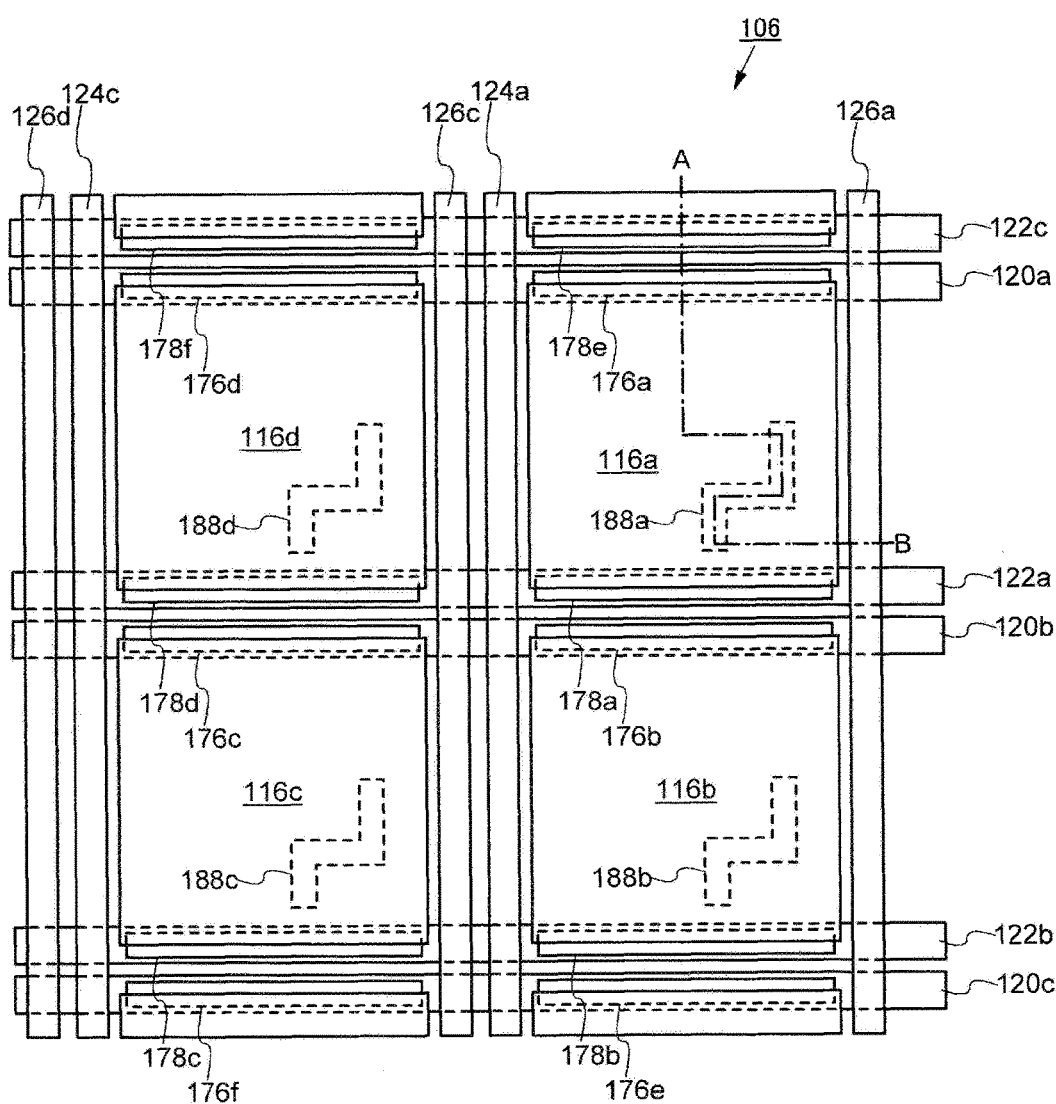
FIG. 15 is a plan view showing a configuration of a pixel unit of the display device according to the embodiment of the present invention.

FIG. 15 shows an aspect in which such pixels 116 as that shown in FIG. 14 are arranged in the pixel unit 106. The following describes parts that are different from those of the first embodiment with reference to FIG. 15 and FIG. 16. FIG. 15 is an arrangement plan of pixels, and FIG. 16 is a cross-sectional view taken along line A-B.

FIG. 15 shows a first pixel 116a, a second pixel 116b, a third pixel 116c, and a fourth pixel 116d, and in each of the pixels, seventh openings 188 (seventh openings 188a to 188d) are provided through which the aforementioned semiconductor region is exposed.

Figure 16:
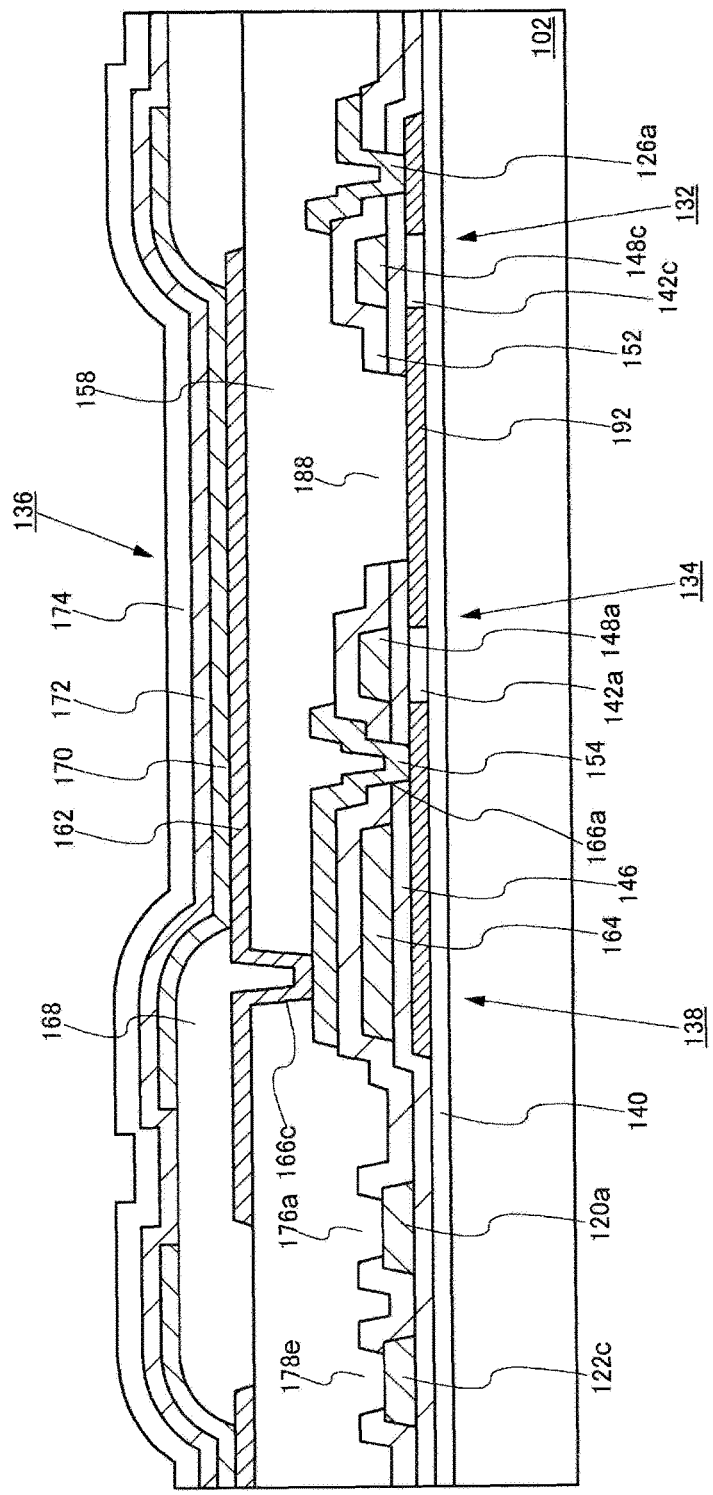
FIG. 16 is a cross-sectional view showing a structure of the pixel unit of the display device according to the embodiment of the present invention.

FIG. 16 shows a cross-sectional structure of the pixel 106, including the drive transistor 134 and the second transistor 132. The semiconductor layer 142a of the drive transistor 134 and the semiconductor layer 142c of the second transistor 132 are continuously provided. The doped semiconductor region linking the semiconductor layers 142a and 142c together functions as a drain wiring 192. While the gate insulating layer 146 and the first insulating layer 152 are provided on a higher level than the semiconductor layers 142a and 142c, those portions of the gate insulating layer 146 and the first insulating layer 152 that are on a higher level than the drain wiring 192 formed by the semiconductor layer have been removed. That is, the gate insulating layer 146 is provided with a seventh opening 188 through which the drain wiring 192 formed by the semiconductor layer is exposed. That is, the upper surface of the drain wiring 192 formed by the semiconductor layer is exposed through the seventh opening 188. The seventh opening 188 is filled with the organic insulating material forming the second insulating layer 158 and functions as a stress relaxation region in the same manner as that described in the first embodiment.

Figure 17:
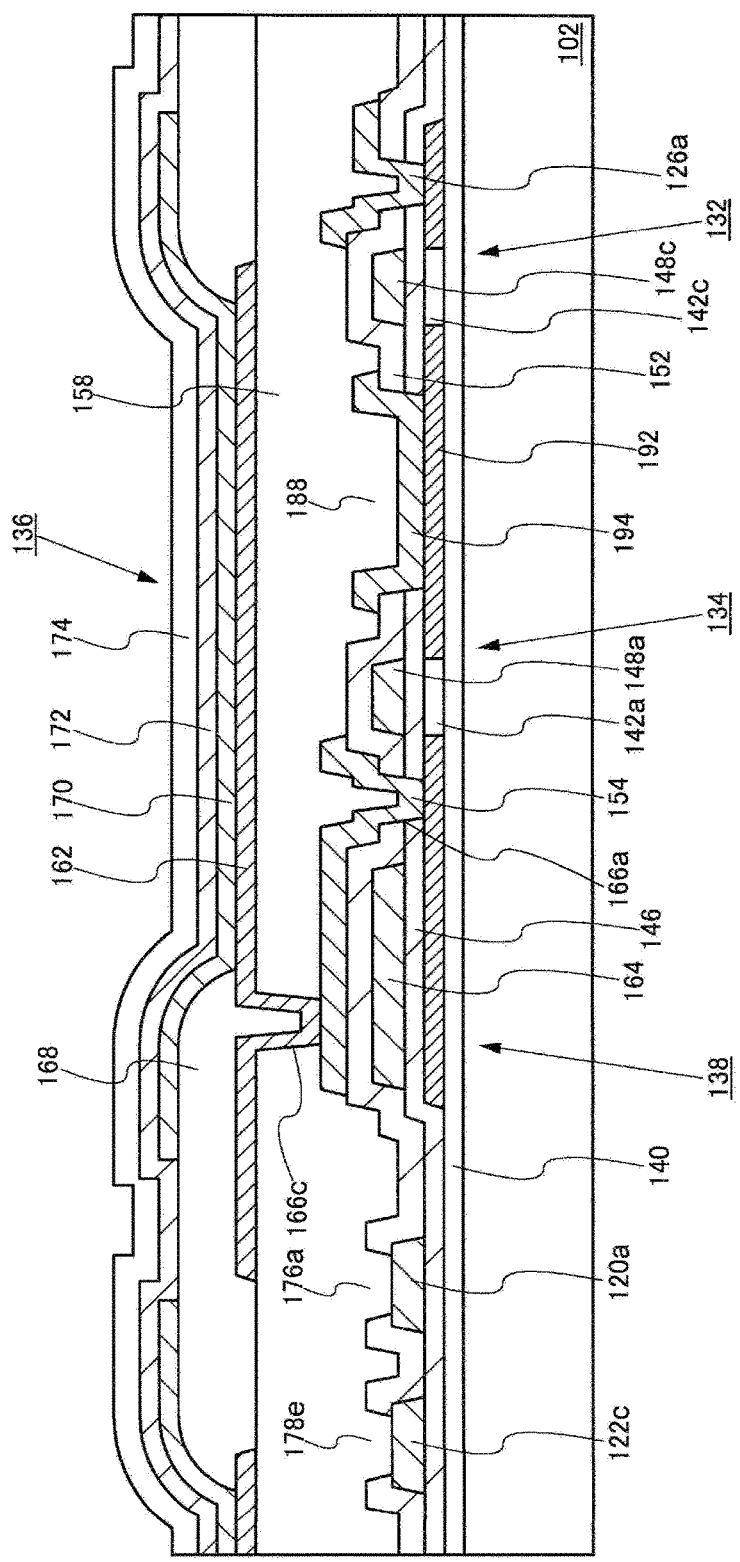
FIG. 17 is a cross-sectional view showing a structure of the pixel unit of the display device according to the embodiment of the present invention.

Further, as shown in FIG. 17, the seventh opening 188 may be provided with a metal wiring layer 194. This allows the seventh opening 188 provided in the gate insulating layer 146 and the first insulating layer 152 to be sealed with the metal wiring layer 194. That is, by providing the metal wiring layer 194 that covers the seventh opening 188 formed in the gate insulating layer 146 and the first insulating layer 152 and is in contact with the drain wiring 192 formed by the semiconductor layer, a sealed structure can be provided in which the semiconductor layers forming the transistors are covered with the inorganic insulating film and the metal film. Further, by providing the seventh opening 188 with the metal wiring layer 194, the drain wiring 192 formed by the semiconductor layer can be made lower in resistance.

By thus providing, in a pixel region, a region from which the inorganic insulating layer is removed, the inorganic insulating layer can be prevented from being cracked when the display device is bent, and the region can be used as a stress relaxation region.

It should be noted that although FIG. 14 and FIG. 15 simultaneously show the first openings 176 (176a to 176f) on the first gate wirings 120 and the second openings 178 (178a to 178f) on the second gate wirings 122, the present embodiment is not limited to this. Alternatively, by providing the seventh openings 188 with only stress relaxation regions only in the pixels 116, the inorganic insulating layer can be prevented from being cracked when the display device is bent. Further, the components of the present embodiment and the components of the first to fourth embodiments may be combined as appropriate for implementation.

Sixth Embodiment

Although the configuration of the pixel unit 106 shown in FIG. 6 shows the top-gate structure of the drive transistor and a corresponding structure of gate wirings and a data wiring, the present invention is not limited to this. For example, the drive transistor may have a reverse-staggered structure, with a corresponding structure of gate wirings and a data wiring.

Figure 18:
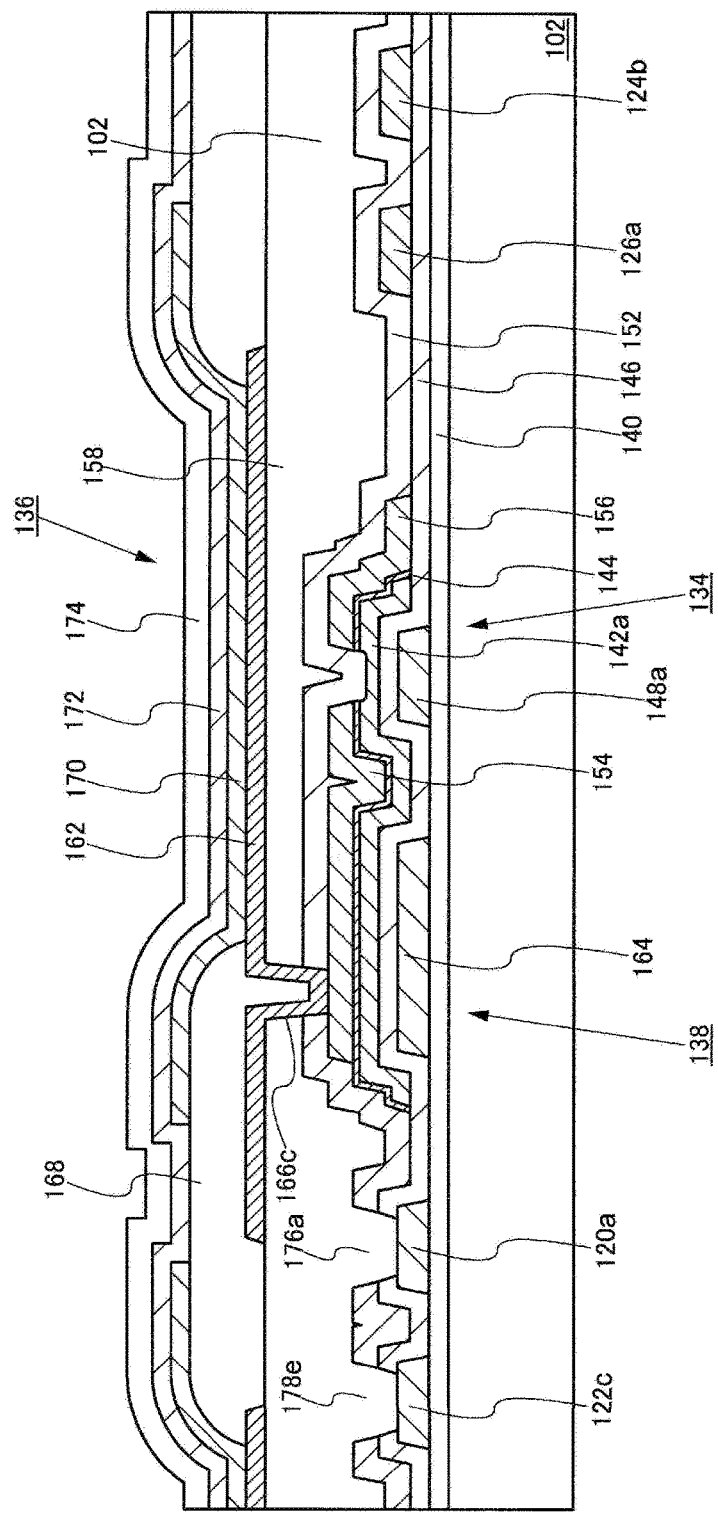
FIG. 18 is a cross-sectional view showing a structure of a pixel unit of a display device according to an embodiment of the present invention.

FIG. 18 shows a configuration of a pixel unit 106 having a revere-staggered drive transistor 134. The gate electrode 148a is provided over the foundation insulating layer 140, and the gate insulating layer 146 and the semiconductor layer 142a are stacked on a higher level than the gate electrode 148a. The source wiring 154 and the drain wiring 156 are provided in contact with the semiconductor layer 142a. It should be noted that a semiconductor layer 144, made lower in resistance, which corresponds to the source region and the drain region, may be provided between the semiconductor layer 142a and the source wiring 154 and between the semiconductor layer 142a and the drain wiring 156. The first insulating layer 152 and the second insulating layer 158 are provided over the source wiring 154 and the drain wiring 156. The configuration on a higher level than the second insulating layer 158 is the same as that shown in FIG. 6.

The first gate wiring 120a and the second gate wiring 122c are formed on a lower level than the gate insulating layer 146. Therefore, the first opening 176a and the second opening 178b are provided in such a way as to penetrate the gate insulating layer 146 as well as the first insulating layer 152. The first opening 176a and the second opening 178e are filled with the inorganic insulating layer forming the second insulating layer 158.

Further, the data wiring 124b and the first power source line 126a, which are formed by the same layer as the source wiring 154 and the drain wiring 156, are covered with the first insulating layer 152. On parts of the upper surfaces of the data wiring 124b and the first power source line 126a, openings equivalent to a third opening 180 and a fourth opening 182 may be provided.

Thus, as in the case of the first embodiment, by wirings disposed in a pixel region, opening provided in an inorganic insulating layer covering these wirings, and an organic insulating layer filling these openings, a structure can be provided which prevents the occurrence of cracks in the inorganic insulating layer by relaxing the stress generated by bending the pixel unit 106.

Seventh Embodiment

The present embodiment exemplifies a structure that makes it possible to control the direction in which a display device is bent, in addition to a stress relaxation structure according to any one of the first to fifth embodiments.

Figure 20:
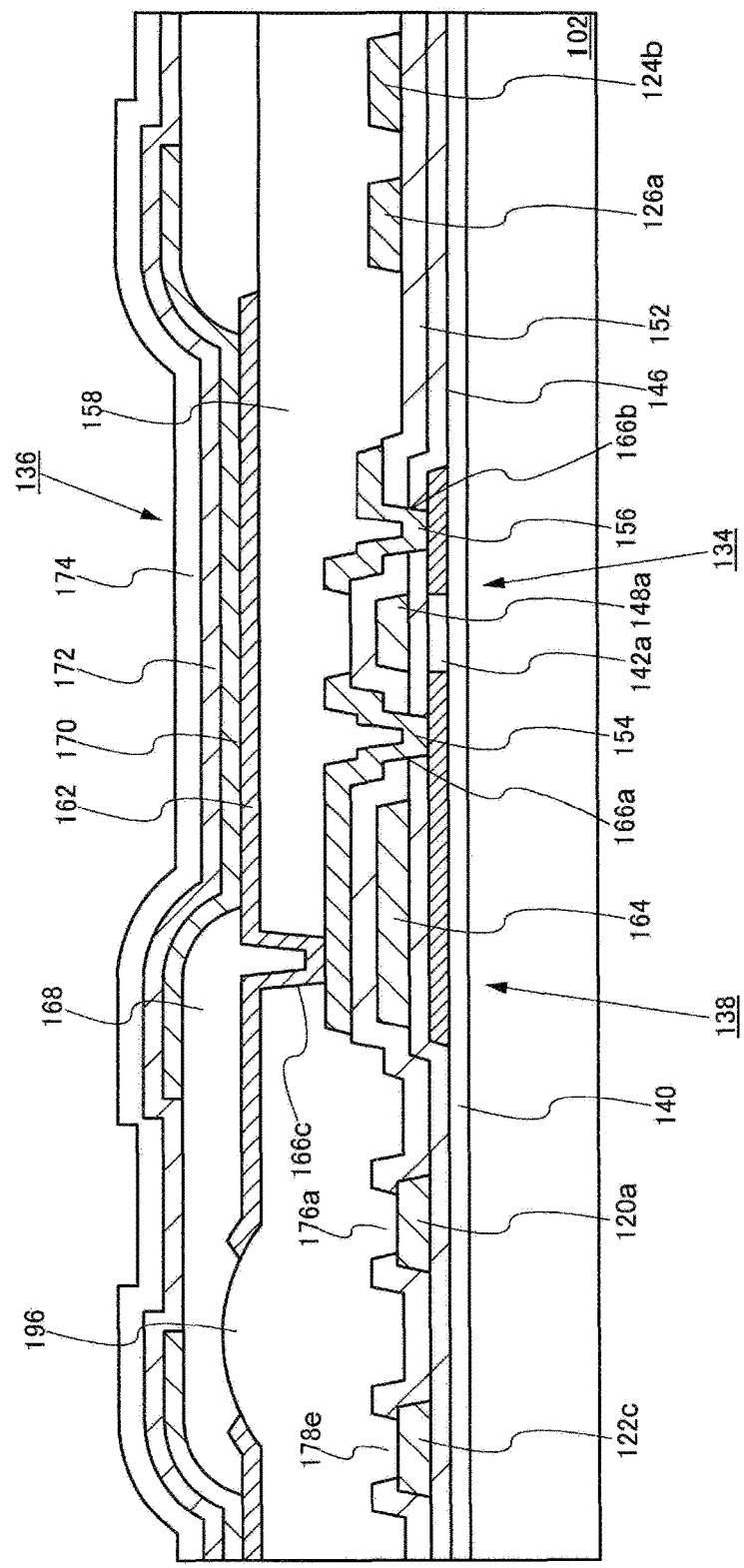
FIG. 20 is a cross-sectional view showing a structure of the pixel unit of the display device according to the embodiment of the present invention.

FIG. 20 shows the same component as the pixel unit 106 shown in the first embodiment, except that the second insulating layer 158 is provided with a raised portion 196 that is larger in film thickness than the other region and that is provided in a region in the second insulating layer 158 that overlaps the first opening 176a and the second opening 178e. That is, although the second insulating layer 158 has a flat region on which the pixel electrode 162 is provided, the second insulating layer 158 is provided with a raised portion 196 that is larger in film thickness than the other regions and that is provided in a region outside the pixel electrode 162. The raised portion 196 of the second insulating layer 158 is provided in such a belt shape along the direction in which the first gate wirings 120 and the second gate wirings 122 extend as to overlap the first opening 176a and the second opening 178e.

Such a raised portion 196 of the second insulating layer 158 acts to make it harder for the display device 100 to be bent in a direction intersecting a direction parallel to the first gate wirings 120 and the second gate wirings 122 than in a case where it is bent in the direction parallel to the first gate wirings 120 and the second gate wirings 122. This makes it harder for one principal surface of the first substrate 102 to be bent in such a direction as to become a concave surface than in a case where the principal surface is bent into an outward convex surface. Further, as shown in FIG. 19, when a stress relaxation structure is provided along the first gate wirings 120 and the second gate wirings 122, providing the raised portion 196 of the second insulating layer 158 along this stress relaxation structure makes it possible to prevent the inorganic insulating layer such as the first insulating layer from being cracked when the display device 100 is bent in one direction.

Figure 21:
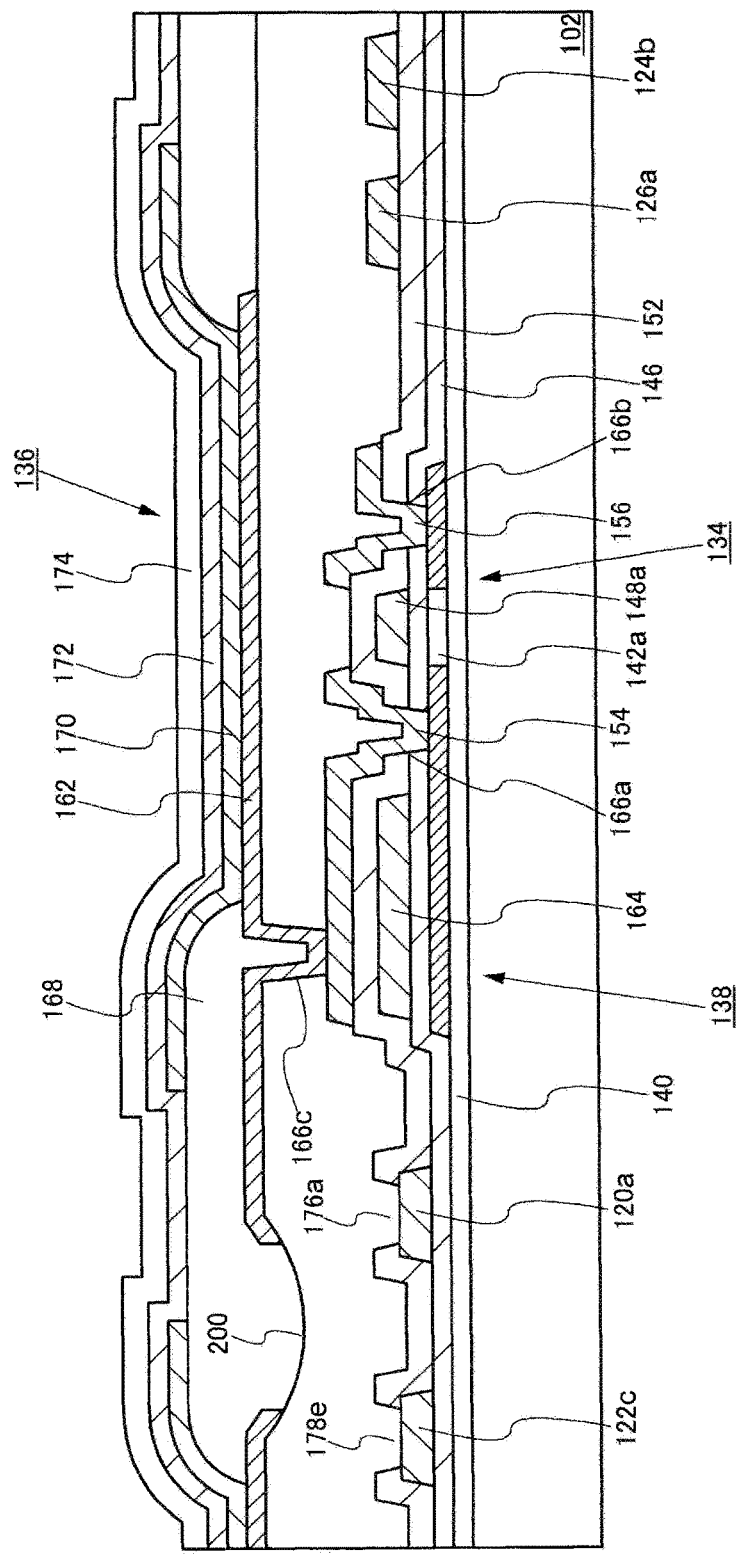
FIG. 21 is a cross-sectional view showing a structure of the pixel unit of the display device according to the embodiment of the present invention.

FIG. 21 shows a configuration in which a depressed portion 200 that is smaller in film thickness than the other regions is provided in a region in the second insulating layer 158 that overlaps the first and second openings 176a and 178e provided in the first insulating layer 152. The depressed portion 200 of the second insulating layer 158 is provided in such a belt shape along the direction in which the first gate wirings 120 and the second gate wirings 122 extend as to overlap the first opening 176a and the second opening 178e.

By the second insulating layer 158 having the depressed portion 200, one principal surface of the first substrate 102 is made easily bendable in a case where it is bent into an inward concave surface. In this case, providing a stress relaxation structure along the direction in which the display device 100 is easily bent makes it possible to prevent the occurrence of cracks in the inorganic insulating layer.

Figure 19:
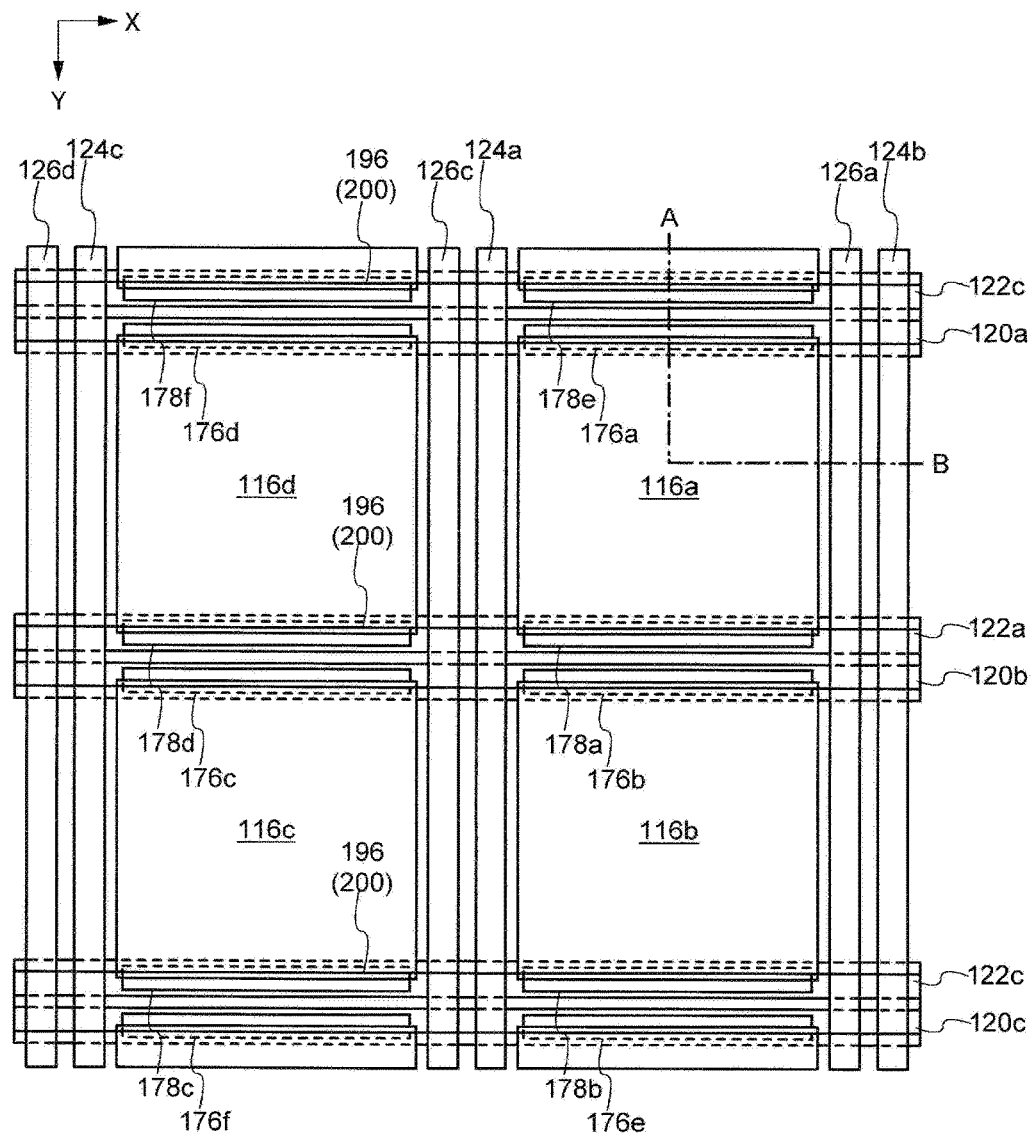
FIG. 19 is a plan view showing a configuration of a pixel unit of a display device according to an embodiment of the present invention.

As shown in FIG. 19, a region between each of the pixels 116 and the other in the pixel unit 106 serves as a non-display region. By providing the second insulating layer 158 with a raised portion 196 or a depressed portion 200 in this region, a structure can be provided which, while retaining the flatness of the pixels 116, controls the direction in which the display device 100 bends.

The shape of a raised portion 196 or a depressed portion 200 on or in the second insulating layer 158 can be formed by etching. For example, the surface of the second insulating layer 158 needs only be etched back so that a raised portion 196 or a depressed portion 200 is formed on or in the second insulating layer 158. Alternatively, a photosensitive organic resin material may be molded into the second insulating layer 158 by a half-exposure technique so that a raised portion 196 or a depressed portion 200 is formed on or in the second insulating layer 158.

Figure 22:
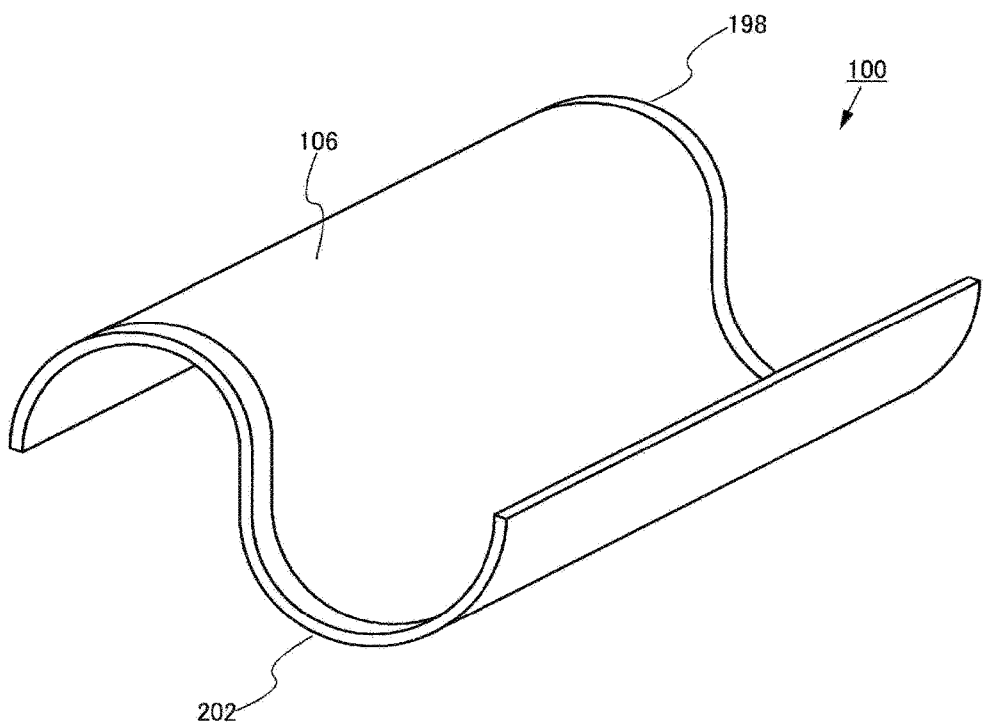
FIG. 22 is a perspective view showing the appearance of the display device according to the embodiment of the present invention.

Such regions, shown in the present embodiment, of the second insulating layer 158 where a raised portion 196 or a depressed portion 200 is provided may be uniformly provided in the pixel unit 106 or may be provided in particular regions. FIG. 22 shows an example of a display device 100 in which, in the pixel unit 106, the second insulating layer 158 is provided with a raised portion region 198 where a raised portion 196 is provided and a depressed portion region 202 where a depressed portion 200 is provided. The display device 100 is bent so that the pixel unit 106 has an outward convex surface in the raised portion region 198 and the pixel unit 106 has a depressed surface in the depressed portion region 202. Further, between the raised portion region 198 and the depressed portion region 202, a region may be provided where the second insulation layer 158 is not provided with a raised portion 196 or a depressed portion 200.

By thus partially providing the raised portion region 198 and the depressed portion region 202, easily bendable regions can be fabricated into the pixel unit 106, thus making it possible to provide a display device 100 having a curved display screen.

Figure 23:
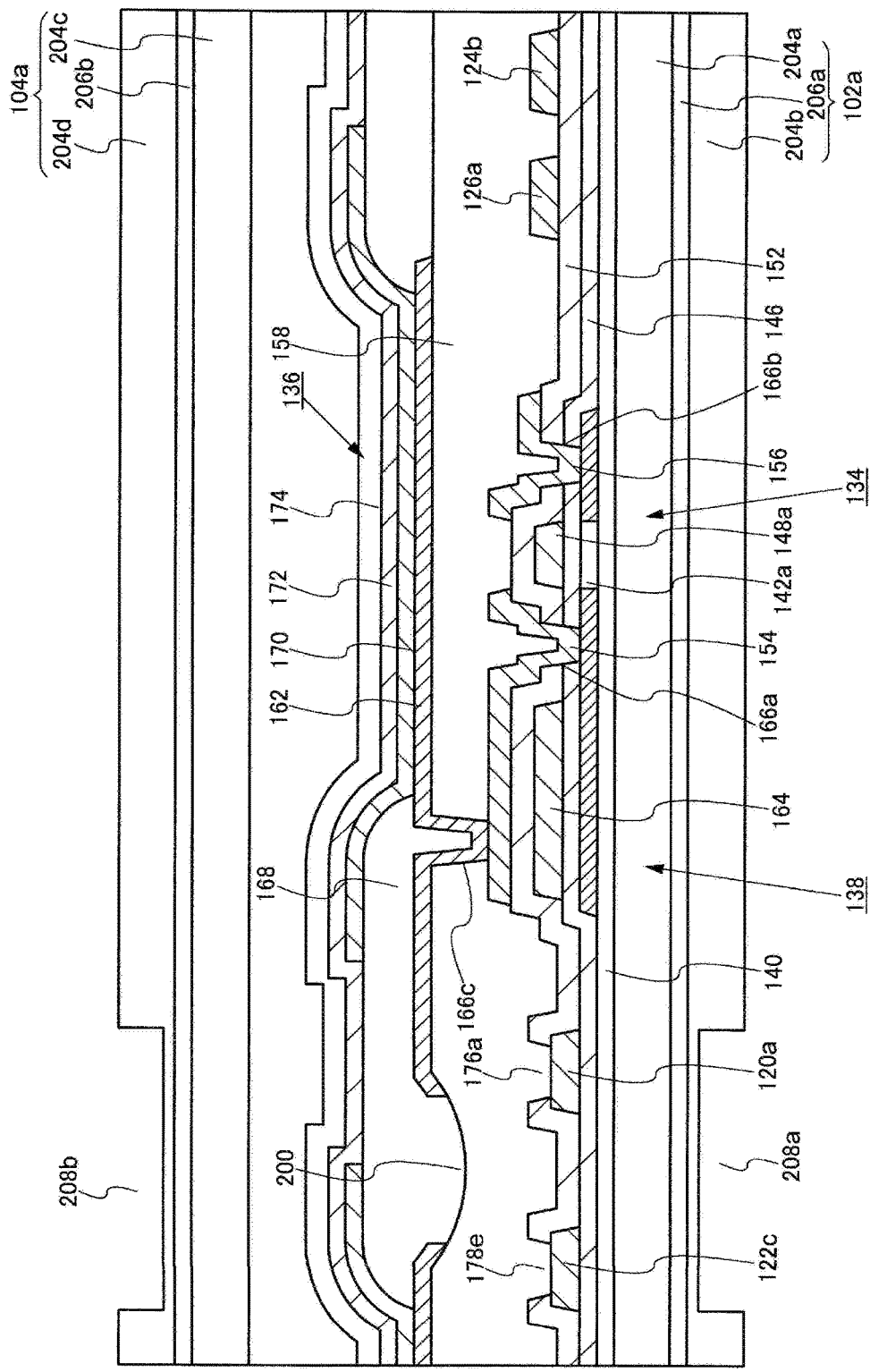
FIG. 23 is a cross-sectional view showing a structure of the pixel unit of the display device according to the embodiment of the present invention.

FIG. 23 shows a case where a first substrate 102a is formed by an organic resin layer having a two-layer structure. The first substrate 102a includes a first resin layer 204a, a second resin layer 204b, and an inorganic insulating layer 206a sandwiched between the first resin layer 204a and the second resin layer 204b. Such a first substrate 102a is provided with a slit 208a by making a part of the first substrate 102a thinner in conformance with a region of the second insulating layer 158 that differs in film thickness. This allows preferential bending of a region around the pixel electrode 162 while minimizing bending of the part where the light-emitting element 136 is provided. This makes it possible to minimize stress on the organic layer 170 of the light-emitting element 136 and, for example, makes it possible to prevent the organic layer 170 from being stripped from the pixel electrode 162.

The first substrate 102a can be provided with the slit 208a by removing or processing the second resin layer 204b so that the second resin layer 204b becomes thinner. For example, the second resin layer 204b can be removed by laser processing with the inorganic insulating layer 206a as a border.

Further, FIG. 23 shows a second substrate 104a placed opposite the first substrate 102a. The second substrate 104a includes a first resin layer 204c, a second resin layer 204d, and an inorganic insulating layer 206b sandwiched between the first resin layer 204c and the second resin layer 204d. Moreover, by providing, in a region that overlaps the slit 208a of the first substrate 102a, a slit 208b from which the second resin layer 204d has been removed, the region around the pixel electrode 162 can be made preferentially bendable. Furthermore, although the slit 208a is provided, the first resin layer 204a is sandwiched between the foundation insulating layer 140 and the inorganic insulating layer 206a. This prevents moisture or oxygen from entering the first resin layer 204a.

It should be noted that the first substrate 102a and the second substrate 104a are not limited to such a two-layer structure, and even in the case of a single-layer structure, a preferentially bendable region can be similarly fabricated by providing slits 208.

According to the present embodiment, the direction in which the display device 100 easily bends can be controlled by providing the second insulating layer 158 with a region that differs in film thickness. A combination of such a configuration and a stress relaxation structure according to any one of the first to fifth embodiments makes it possible to provide a display device that is easily bent in a predetermined direction and, even when bent, can be prevented from deteriorating.

Eighth Embodiment

Figure 24:
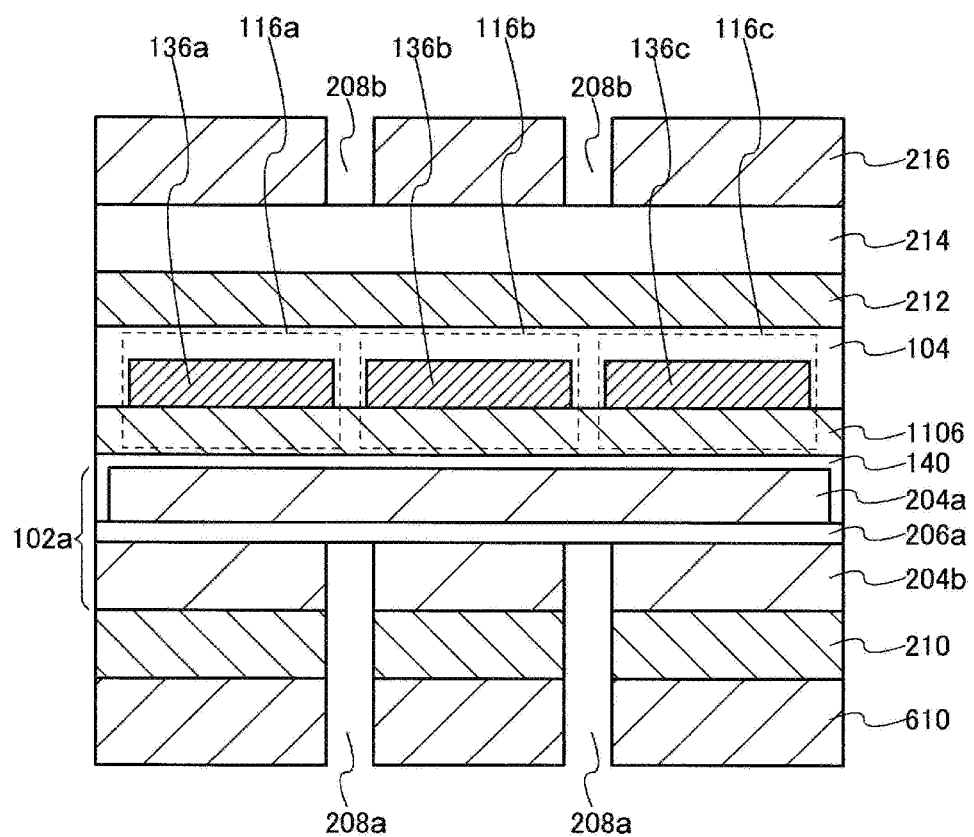
FIG. 24 is a cross-sectional view showing a configuration of a pixel unit of a display device according to an embodiment of the present invention.

While the seventh embodiment discloses a structure in which the first substrate 102a varies in thickness from one part thereof to another, the present embodiment can make the display device 100 flexible by adding slits at a module level. FIG. 24 is a schematic view of a cross-sectional structure of a display device 100 provided with slits at a module level.

In FIG. 24, the foundation insulating layer 140 is provided over the first substrate 102a, and a pixel circuit unit 1106 is provided on the upper surface of the foundation insulating layer 140. Light-emitting elements 136a to 136c are provided over the pixel circuit unit 1106. The second substrate 104 is provided on a higher level than the light-emitting elements 136. An optical film 212 such as a circularly polarizing plate, a touch panel 214, and a protective film 216 are provided on a higher level than the second substrate 104.

Moreover, the first substrate 102a (specifically, the resin layer 204b), a heat-diffusing plate 210, and a protective film 610 are provided with slits 208a and the protective film 216 is provided with slits 208b so that the slits 208a and 208b overlap a region in the pixel circuit unit 1106 where a stress relaxation region is provided. This allows the module structure to ensure flexibility as a whole. Further, the protective film 216 may be similarly provided with the slits 208b in positions that correspond to the slits 208a in the first substrate 102a. These slits are disposed on the borders of a light-emitting element 136 and a light-emitting element 136.

It should be noted that although FIG. 24 shows an aspect in which each of the pixels 116 is provided with a slit, the present invention is not limited to this aspect. For example, each block unit of pixels may be provided with a slit. Further, slits may extend only in either the column-wise or row-wise direction in which the pixels are arranged. In either case, it is preferable that slits that are provided at a module level be provided in such a way as to overlap a stress relaxation region that is provided in the pixel unit 106.

Thus, by providing the heat-diffusing plate and the protective film with slits, the present embodiment can provide a display device having flexibility at a module level. Furthermore, although the slits 208a are provided, the first resin layer 204a is completely surrounded by the foundation insulating layer 140 and the inorganic insulating layer 206. This prevents moisture or oxygen from entering the first resin layer 204a.

Ninth Embodiment

Figure 25:
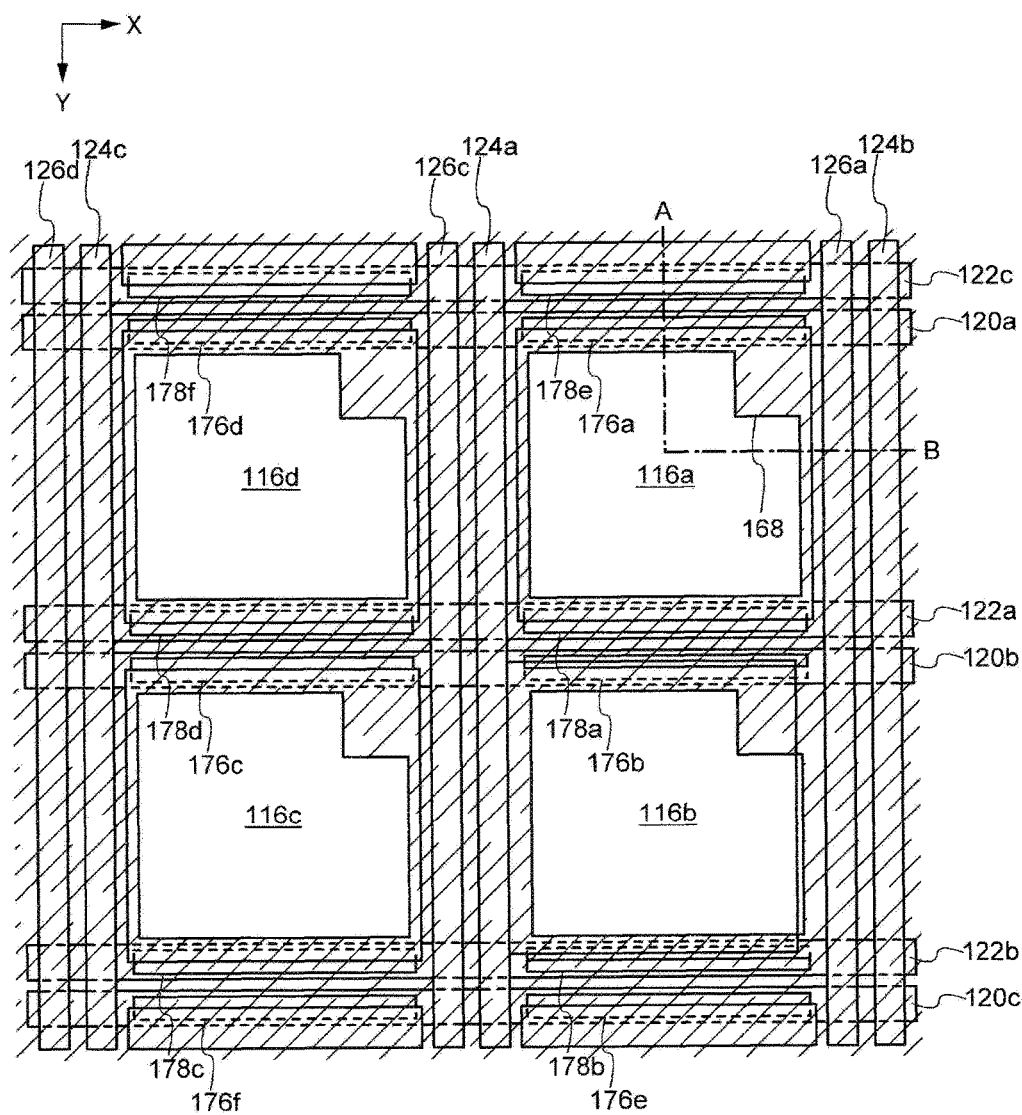
FIG. 25 is a plan view showing a configuration of a pixel unit of a display device according to an embodiment of the present invention.
Figure 26:
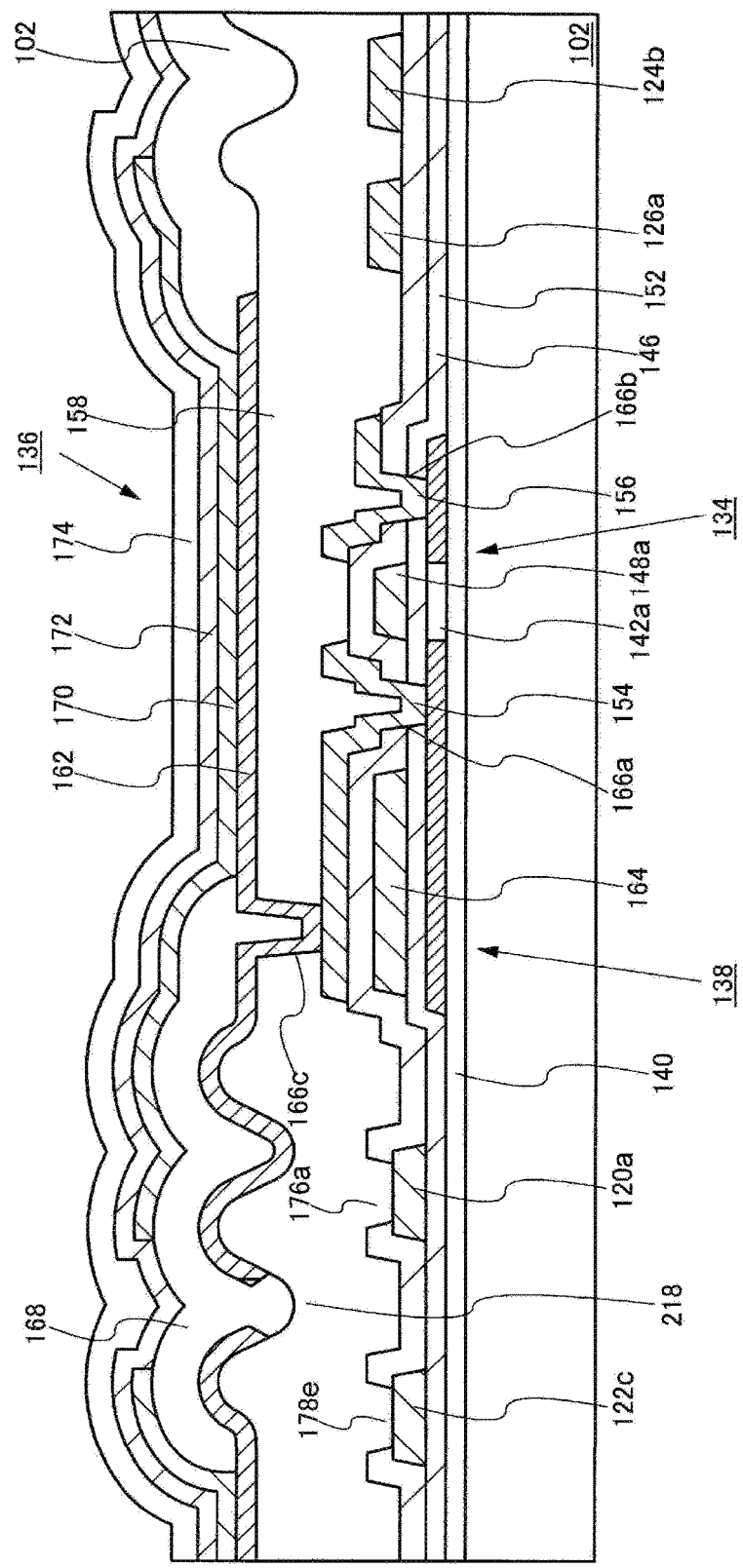
FIG. 26 is a cross-sectional view showing a structure of the pixel unit of the display device according to the embodiment of the present invention.

The present embodiment shows an example of a display device whose display screen can be bent. FIG. 25 shows an example of a pixel unit 106 according to the present embodiment, and FIG. 26 shows a cross-sectional structure taken along line A-B in FIG. 25. The following description refers to FIG. 25 and FIG. 26.

FIG. 25 shows a configuration of the pixel unit 106 in which the first pixel 116a, the second pixel 116b, the third pixels 116c, and the fourth pixel 116d are arranged, with the superimposition of the bank layer 168 through which the pixel electrode of each of the pixels is exposed. In the present embodiment, the pixel unit 106 has a corrugated region 218 where the second insulating layer 158 has a wavy or corrugated (or embossed) upper surface that overlaps the bank layer 168. In other words, the second insulating layer 158 has a wavy or corrugated region that overlaps the bank layer 168 and that includes a thick-film region and a thin-film region.

The wavy or corrugated region 218 in the second insulation layer 158 can be provided one or more regions (including all of the regions) selected from the following regions: a region that overlaps the first opening 176a and the second opening 178e, a region that overlaps the third opening 180c and the fourth opening 182d, and a region that overlaps the first opening 176 to the fourth opening 182. By thus providing the second insulation layer 158 with the wavy or corrugated region 218 so that the wavy or corrugated region 218 overlaps openings provided in the first insulating layer 152, the first insulating layer 152 can be prevented from being cracked in a region where the first substrate 102 is bent.

According to the present embodiment, by providing the second insulating layer 158 with a wave shape or a corrugated shape, the surface of the first substrate 102 to which the pixel unit 106 is provided can be made easily bendable both inward and outward. In this case, a combination of configurations according to the first to fifth embodiments makes it possible to prevent the occurrence of cracks in the first insulating layer 152.

Tenth Embodiment

An embodiment of the present invention is not limited in terms of the arrangement of pixels 116 in the pixel unit 106.

Figure 27:
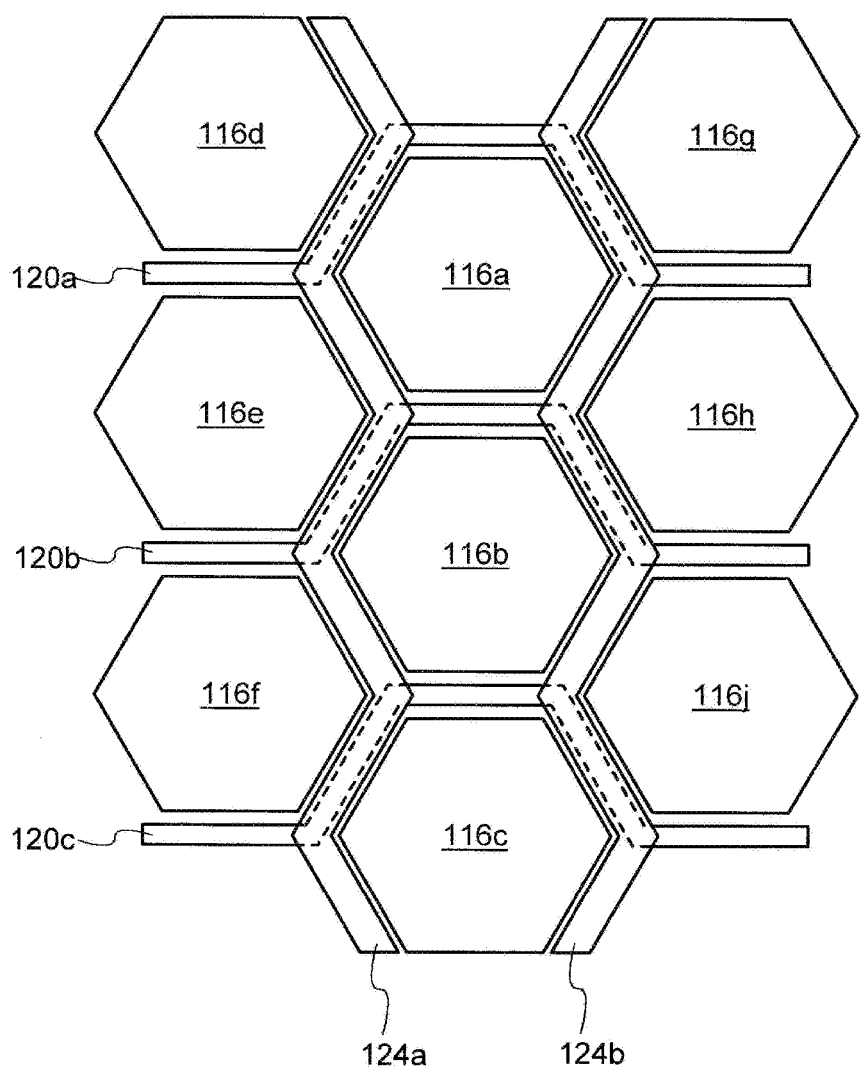
FIG. 27 is a plan view showing a configuration of a pixel unit of a display device according to an embodiment of the present invention.

For example, as shown in FIG. 27, the pixels 116 (i.e. pixels 116a to 116j) may be arranged in a honeycomb structure, and the gate wirings 120 and the data wirings 124 may extend in a zigzag through spaces between pixels. In such a pixel unit 106, by providing a stress relaxation region according to any one of the first to fifth embodiments and applying a structure of the second insulating layer 158 according to the sixth or seventh embodiment, a structure can be applied in which the pixel unit 106 is easily bent in any direction.

What is claimed is:

1. A display device comprising:
    a flexible substrate;
    a pixel over the flexible substrate, the pixel including a transistor and a display element;
    a first wiring for transmitting a signal to the pixel, the first wiring extending in a first direction;
    a second wiring extending in a second direction intersecting the first direction;
    an inorganic insulating layer on a higher level than the first wiring or the second wiring; and
    an organic insulating layer on a higher level than the inorganic insulating layer,
    wherein the inorganic insulating layer has an opening exposing a part of an upper surface of the first wiring or the second wiring, and
    the organic insulating layer is provided in such a way as to fill the opening.

2. The display device according to claim 1, wherein the opening is provided along one side of the pixel.

3. The display device according to claim 1, wherein the opening is provided in a region where the substrate is bent.

4. The display device according to claim 1, wherein the first wiring is a gate wiring for transmitting a signal to a gate of the transistor.

5. The display device according to claim 1, wherein the second wiring is a data wiring for transmitting a data signal to the pixel.

6. The display device according to claim 1, wherein the first wiring is a gate wiring for transmitting a signal to a gate of the transistor,
    the second wiring is provided on a higher level than the first wiring and is a data wiring for transmitting a data signal to the pixel, and
    the inorganic insulating layer is provided between the first wiring and the second wiring and has an opening through which the upper surface of the first wiring is exposed.

7. The display device according to claim 1, wherein the first wiring is a gate wiring for transmitting a signal to a gate of the transistor,
    the second wiring is provided on a higher level than the first wiring and is a data wiring for transmitting a data signal to the pixel,
    the inorganic insulating layer is a plurality of inorganic insulating layers,
    the inorganic insulating layers include a first inorganic insulating layer provided between the first wiring and the second wiring and a second inorganic insulating layer provided between the second wiring and the organic insulating layer,
    a laminate of the first inorganic insulating layer and the second inorganic insulating layer has a first opening through which the part of the upper surface of the first wiring is exposed, and
    the second inorganic insulating layer has a second opening through which the part of the upper surface of the second wiring is exposed.

8. The display device according to claim 1, wherein the first wiring is a gate wiring for transmitting a signal to a gate of the transistor,
    the second wiring is provided on a higher level than the first wiring and is a data wiring for transmitting a data signal to the pixel,
    the inorganic insulating layer is a plurality of inorganic insulating layers,
    the inorganic insulating layers include a first inorganic insulating layer provided between the first wiring and the second wiring and a second inorganic insulating layer provided between the second wiring and the organic insulating layer,
    the first inorganic insulating layer has a first opening in a region that overlaps the second wiring,
    the second inorganic insulating layer has a second opening through which the part of the upper surface of the second wiring is exposed, and
    the second wiring is in contact with a metal pattern through the first opening, the metal pattern being provided along the second wiring.

9. The display device according to claim 1, wherein the transistor includes a semiconductor layer, a gate insulating layer over the semiconductor layer, and a gate electrode over the gate insulating layer,
    the pixel is provided on a same level as the semiconductor layer and includes a semiconductor wiring region containing an impurity of one conductivity type, and
    the inorganic insulating layer has an opening through which a part of the upper surface of the semiconductor wiring region is exposed.

10. The display device according to claim 9, further comprising a metal wiring layer provided in the opening through which the part of the upper surface of the semiconductor wiring region is exposed.

11. The display device according to claim 1, wherein the organic insulating layer has a raised portion in a region that overlaps the opening, the raised portion being larger in film thickness.

12. The display device according to claim 1, wherein the organic insulating layer has a depressed portion in a region that overlaps the opening, the depressed portion being smaller in film thickness.

13. The display device according to claim 1, wherein the organic insulating layer has a corrugated surface in a region that overlaps the opening.

14. The display device according to claim 1, wherein the substrate is provided with a slit in a region that includes the opening.

15. The display device according to claim 14, wherein the substrate is adhered to by a heat-diffusing sheet provided in a position that overlaps the slit in the substrate.

16. The display device according to claim 14, further comprising a protective film covering the pixel provided over the substrate,
    wherein the protective film is provided with a slit in a position that overlaps the slit in the substrate.

17. A display device comprising a pixel unit,
    the pixel unit including:
    a plurality of pixels arranged in a first direction and a second direction intersecting the first direction;
    first wirings for transmitting signals to the plurality of pixels arranged in the first direction, the first wirings extending along the first direction;

second wirings for transmitting signals to the plurality of pixels arranged along the second direction intersecting the first direction, the second wirings extending in the second direction intersecting the first direction; and an inorganic insulating layer covering at least either the first wirings or the second wirings, wherein the inorganic insulating layer has openings exposing at least either the first wirings or the second wirings, and the openings are provided along at least either the first direction or the second direction intersecting the first direction.

18. The display device according to claim 17, wherein the pixel unit includes an organic insulating layer covering the inorganic insulating layer and filling the openings.

19. The display device according to claim 17, wherein the organic insulating layer has its surface raised, depressed, or corrugated in regions that overlap the openings.

20. The display device according to claim 17, wherein the pixel unit has curved surfaces, and the openings are provided in the curved surfaces.

* * * * *